United States Patent
Sawano et al.

(10) Patent No.: US 7,014,986 B2
(45) Date of Patent: Mar. 21, 2006

(54) WRITING DEVICE AND WRITING METHOD

(75) Inventors: Mitsuru Sawano, Kanagawa (JP); Yoji Okazaki, Kanagawa (JP); Kazuhiko Nagano, Kanagawa (JP); Hiromi Ishikawa, Kanagawa (JP); Takeshi Fujii, Kanagawa (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 6 days.

(21) Appl. No.: 10/455,403

(22) Filed: Jun. 6, 2003

(65) Prior Publication Data

US 2003/0228543 A1 Dec. 11, 2003

(30) Foreign Application Priority Data

Jun. 7, 2002 (JP) .............................. 2002-167409

(51) Int. Cl.
*B41J 21/447* (2006.01)

(52) U.S. Cl. .......................... 430/311; 355/63; 355/67; 347/250; 347/239

(58) Field of Classification Search ................ 347/239, 347/250; 355/67, 53; 430/311
See application file for complete search history.

(56) References Cited

U.S. PATENT DOCUMENTS

| | | | | |
|---|---|---|---|---|
| 5,602,620 A | * | 2/1997 | Miyazaki et al. | 355/53 |
| 6,573,924 B1 | * | 6/2003 | Miyagawa et al. | 347/239 |
| 2002/0158961 A1 | * | 10/2002 | Sawano et al. | 347/213 |
| 2003/0214571 A1 | * | 11/2003 | Ishikawa et al. | 347/255 |
| 2003/0222966 A1 | * | 12/2003 | Shirota | 347/239 |

FOREIGN PATENT DOCUMENTS

| | | |
|---|---|---|
| JP | 10-112579 A | 4/1998 |
| JP | 10-112585 A | 4/1998 |
| JP | 11-163499 A | 6/1999 |
| JP | 11-253860 A | 9/1999 |
| JP | 11-274671 A | 10/1999 |
| JP | 2001-56567 A | 2/2001 |
| JP | 2001-125274 A | 5/2001 |

* cited by examiner

*Primary Examiner*—John A. McPherson
*Assistant Examiner*—Daborah Chacko-Davis
(74) *Attorney, Agent, or Firm*—Sughrue Mion, PLLC

(57) ABSTRACT

A writing device is provided which, in simple processes, can write in two dimensions and three dimensions, and which can form highly accurate patterns. An exposure head, a conductive material discharging head, and an insulating material discharging head are disposed at one scanning stage. At the one scanning stage, a pattern can be formed on a printed board which is on the scanning stage. As a result, processes can be simplified, time between patternings can be shortened, and pattern formation can be made to be faster. Moreover, positional offset of the exposure head and the discharging heads with respect to the printed board does not arise. Thus, it is easy to increase a density of a pattern, and a highly accurate pattern is formed.

15 Claims, 29 Drawing Sheets

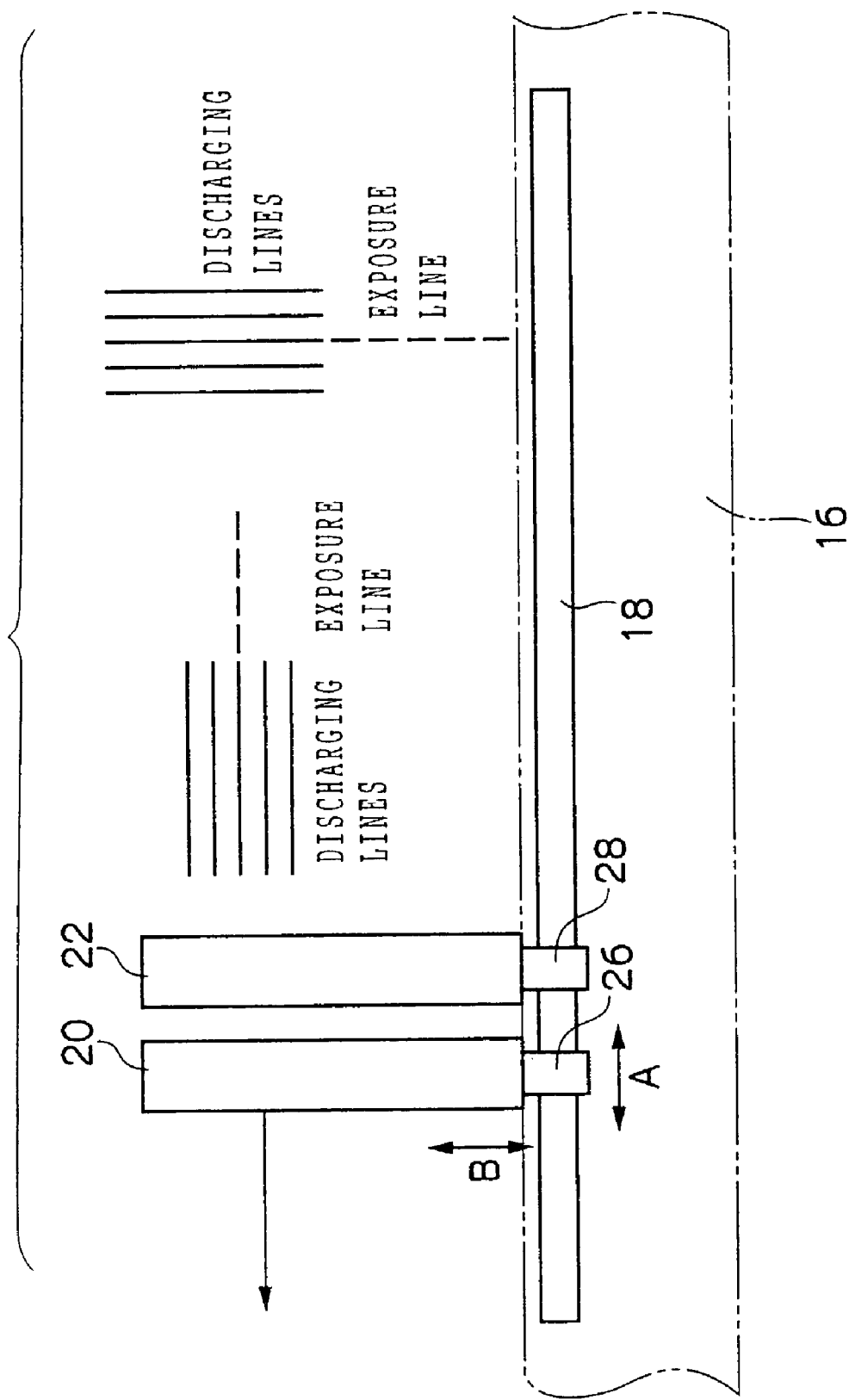

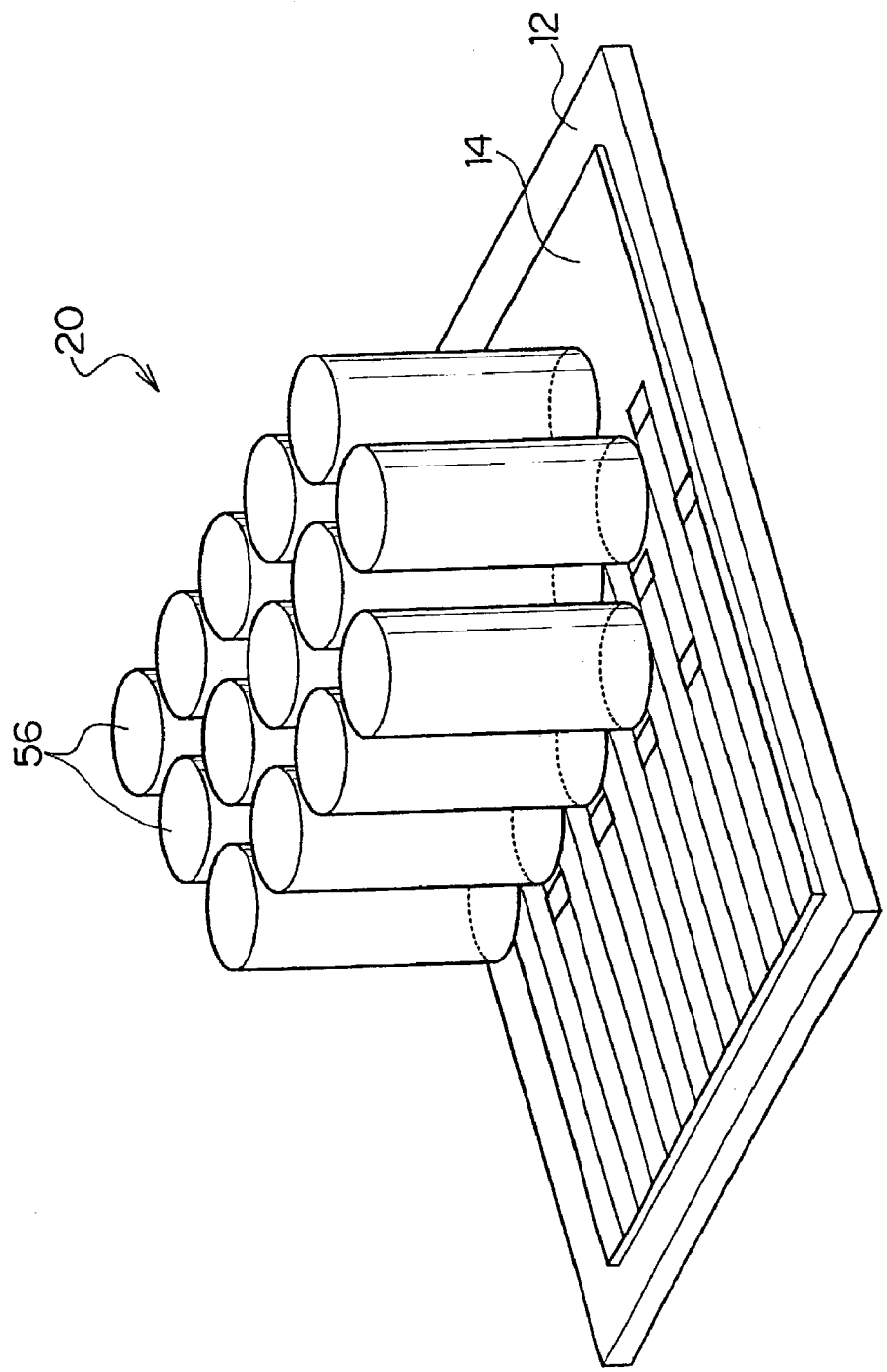

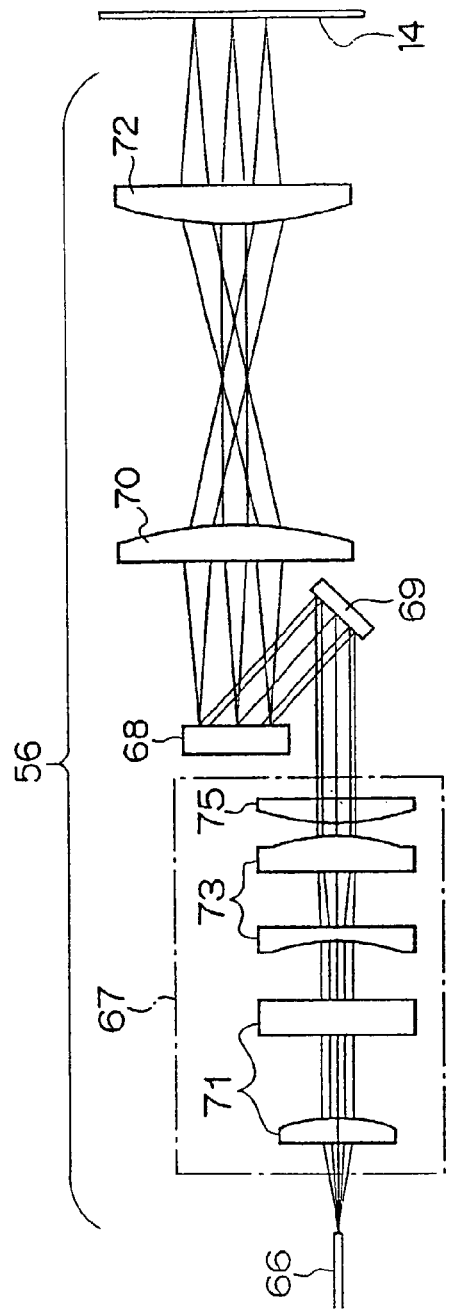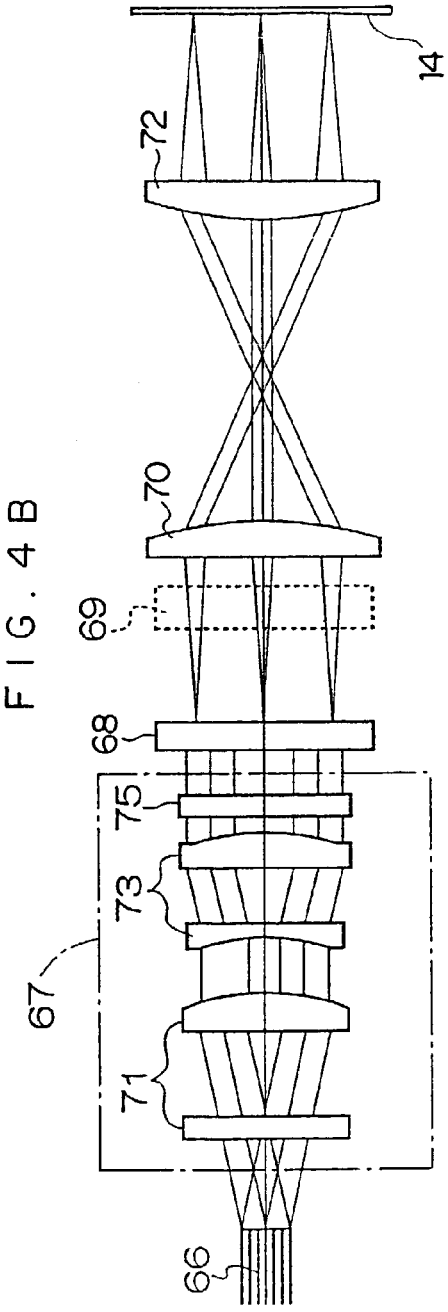

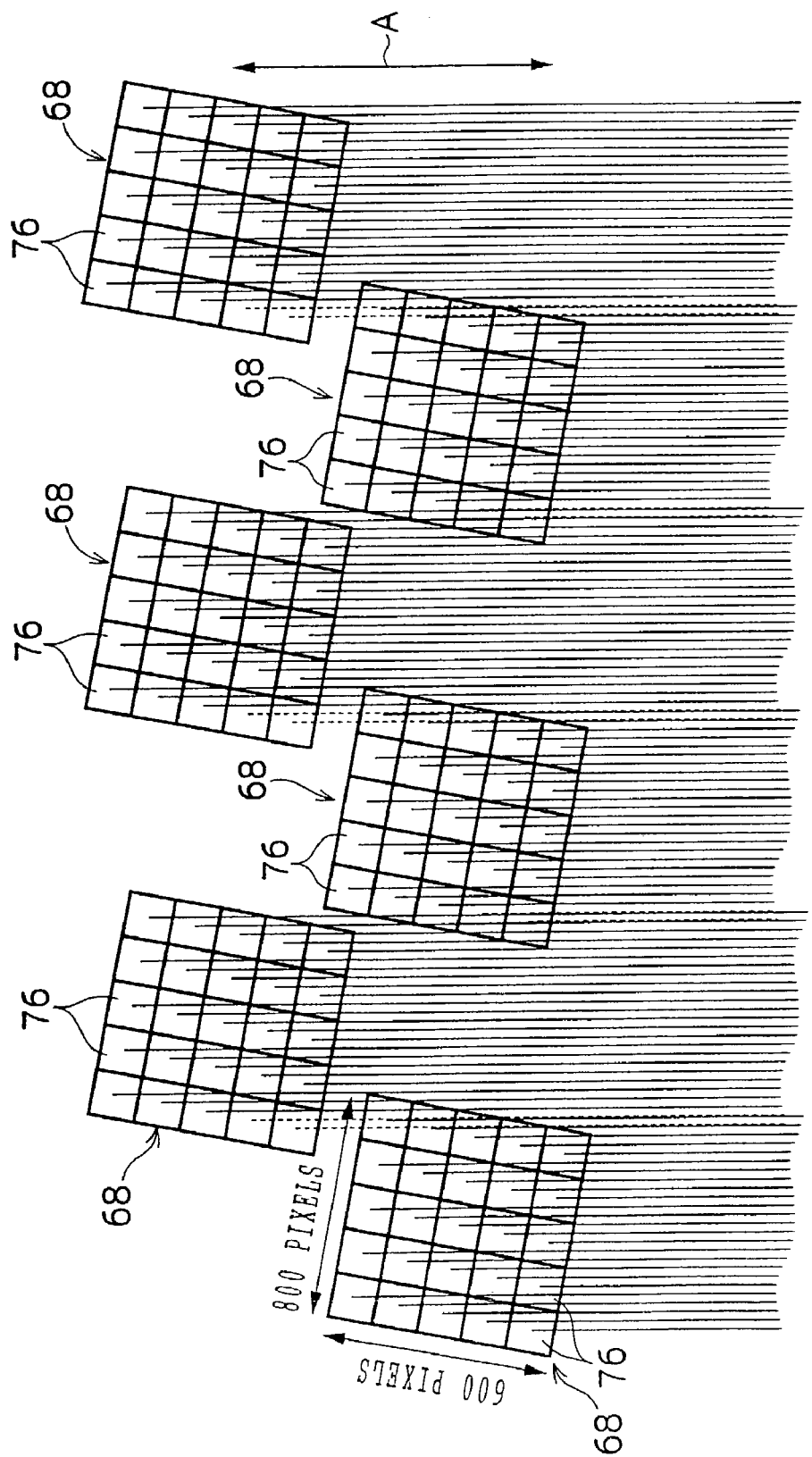

DISCHARGE INSULATING RESIN DISPERSED LIQUID

DISCHARGE COPPER PARTICULATE RESIN CAPSULE DISPERSED LIQUID

EXPOSE ENTIRE SURFACE BY LASER EXPOSURE HEAD

DISCHARGE INSULATING RESIN DISPERSED LIQUID
DISCHARGE COPPER PARTICULATE RESIN CAPSULE
DISPERSED LIQUID

EXPOSE ENTIRE SURFACE BY LASER EXPOSURE HEAD

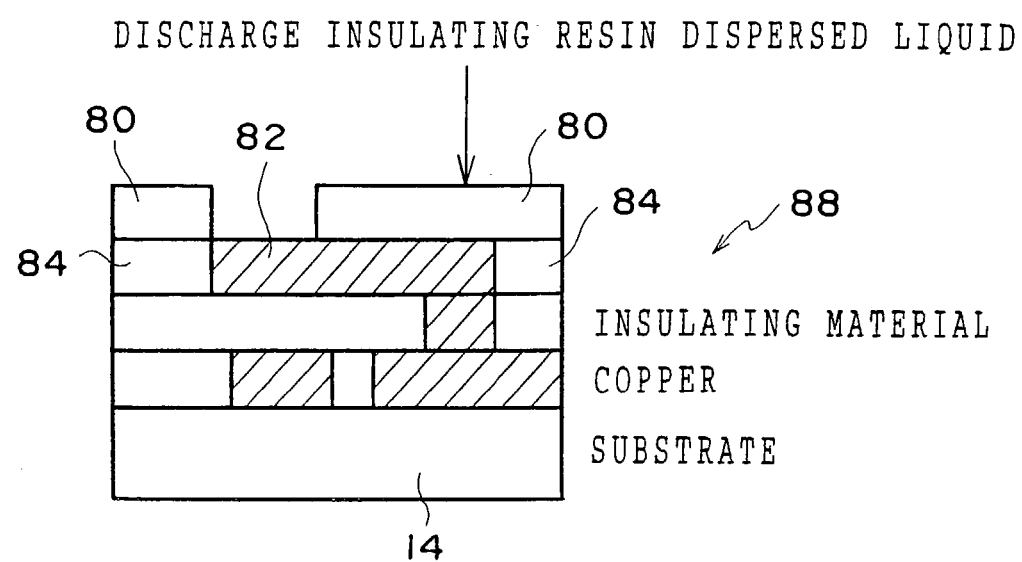

F I G. 9A
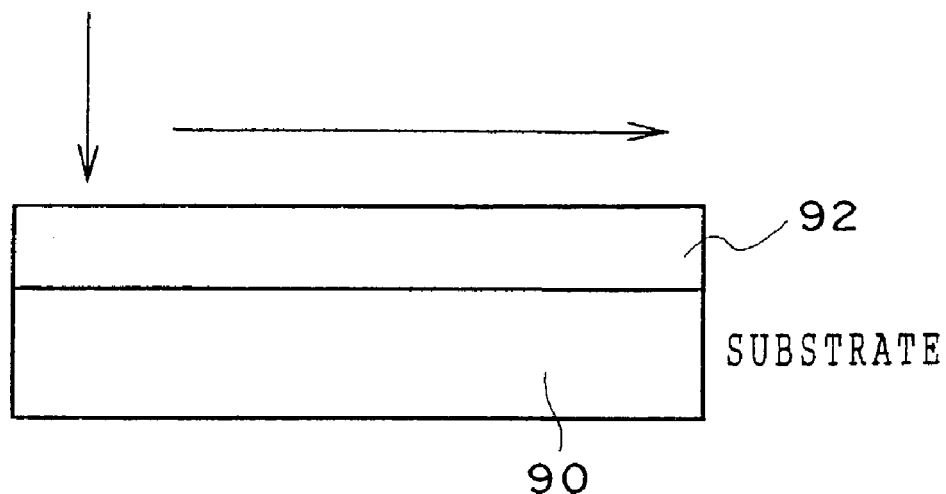
F I G. 9B
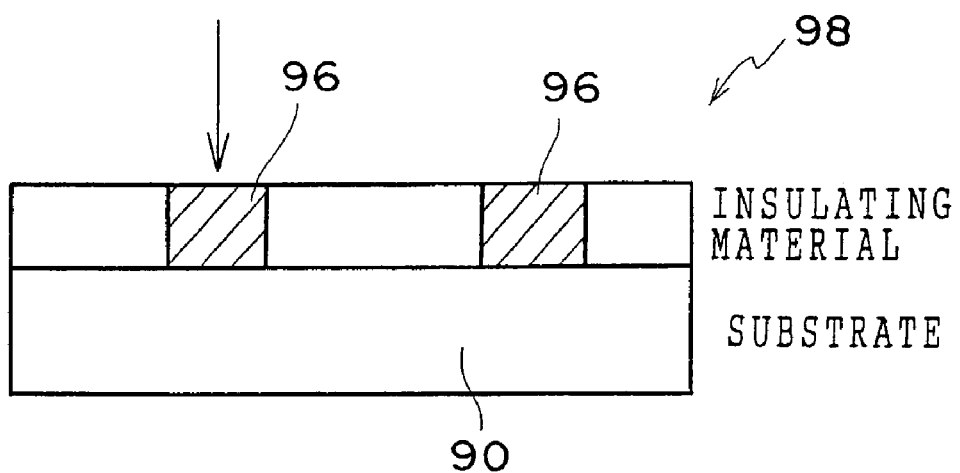

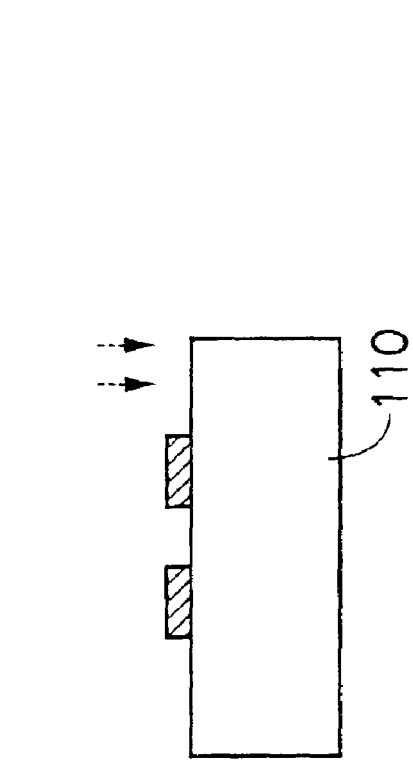
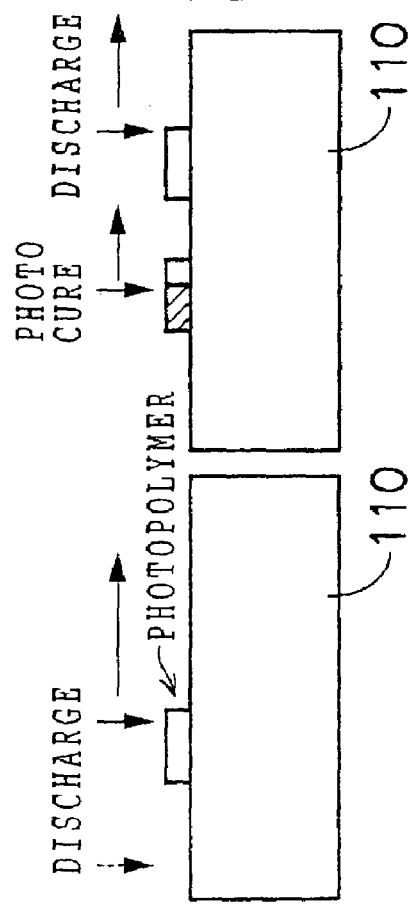
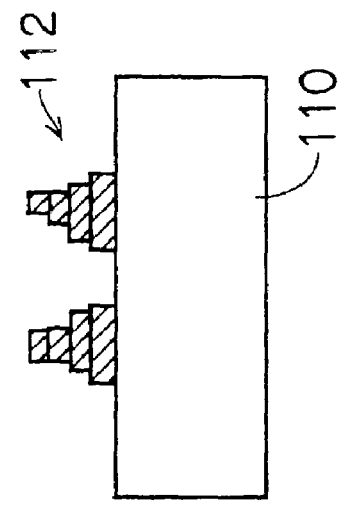
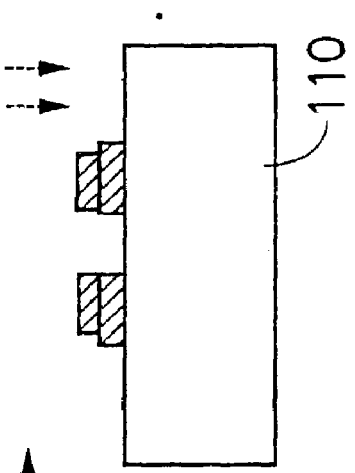

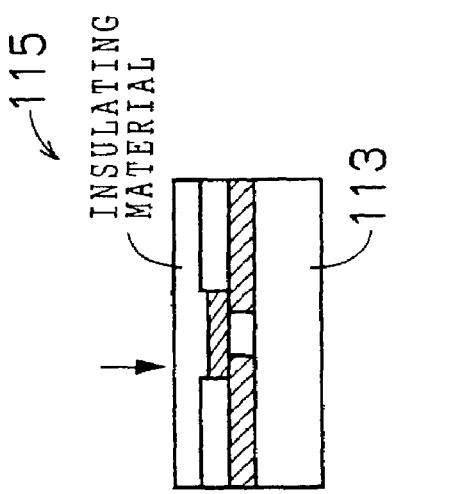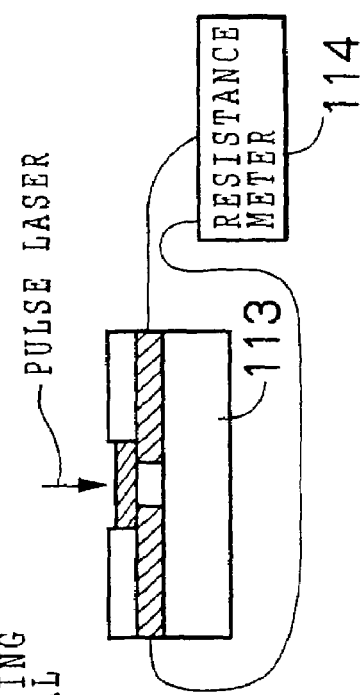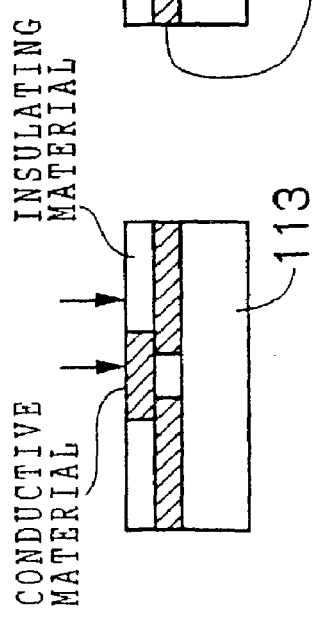

COPPER PLATED SUBSTRATE

LAMINATE FILM-LIKE RESIST

COPPER
SUBSTRATE
COPPER

EXPOSE AND HARDEN PHOTORESIST

COPPER
SUBSTRATE
COPPER

DEVELOP AND ETCH

PEEL-OFF

LAMINATE FILM-LIKE RESIST

DEVELOP

PLATING

PEEL-OFF

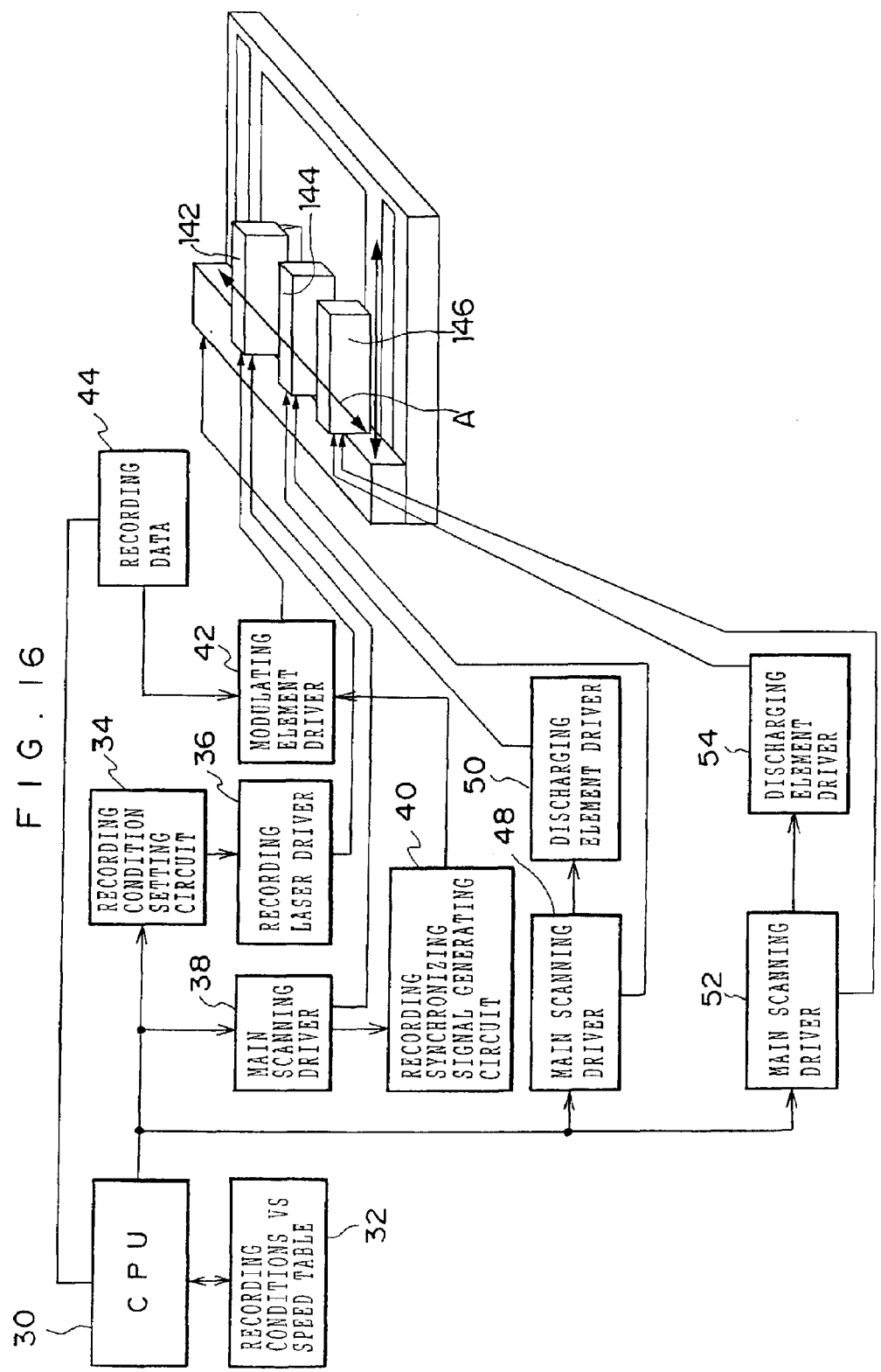

COAT (OR LAMINATE)

DEVELOP

ETCH

PHOTORESIST
COPPER
SUBSTRATE

PEEL-OFF

COPPER
SUBSTRATE

COAT

INSULATING MATERIAL
COPPER
SUBSTRATE

FORM HOLES BY LASER

INSULATING MATERIAL
COPPER
SUBSTRATE

COPPER PLATING

COAT (OR LAMINATE)

DEVELOP

ETCH

PEEL-OFF

SCREEN PRINTING

WRITING DEVICE AND WRITING METHOD

BACKGROUND OF THE INVENTION

1. Field of the Invention

The present invention relates to a writing method carrying out writing of a multi-layer circuit pattern or the like, and to a writing method using the writing device.

2. Description of the Related Art

In recent years, light modulating elements have been used in methods of fabricating multi-layer circuit patterns. In a specific method of fabricating a multi-layer circuit pattern, first, as shown in FIG. 17A, the surface of a printed board is copper plated. Thereafter, as shown in FIG. 17B, a photosensitive resin called a photoresist is coated thereon.

When light is irradiated on the photoresist, the photoresist hardens (although there are cases in which the photoresist softens when light is irradiated thereon). After the photoresist is exposed by light modulating elements as shown in FIG. 17C, when developing is carried out (see FIG. 17D), the exposed portions of the photoresist remain, and the other portions are rinsed off.

Then, as shown in FIG. 17E, the copper at the portions where the photoresist was rinsed off is etched by etching. Thereafter, as shown in FIG. 17F, the photoresist is peeled off. An insulating material is coated on the entire surface (see FIG. 17G).

Next, as shown in FIG. 17H, holes are formed by a laser at the portions where the top and bottom must be made continuous. Thereafter, as shown in FIG. 17I, copper plating is carried out. A photoresist is coated (see FIG. 17J).

Then, after the photoresist is exposed by light modulating elements as shown in FIG. 17K, developing is carried out (see FIG. 17L). In this way, the portions of the photoresist which were not exposed are rinsed off. As shown in FIG. 17M, etching is carried out such that the copper at the unexposed portions is etched.

Next, after the photoresist is peeled off as shown in FIG. 17N, an insulating material is coated by screen printing as shown in FIG. 17O. Here, hole portions are formed in advance in the screen printing. Solder is adhered within these hole portions, and electronic parts or the like are made continuous via the soldering.

Here, devices are provided separately for the process of coating a conductive material or an insulating material on the medium on which writing is carried out, and the process of exposing the photoresist. The medium on which writing is carried out is set on stages provided at the respective devices, and the respective processes are carried out. Thus, the medium on which writing is carried out must be set at a stage each time a process is to be carried out, and much time is required for the operation.

Moreover, because a device is provided independently for each process, positioning of the medium on which writing is carried out must be carried out each time a process is to be carried out. When a laminated pattern is to be formed, there are cases in which positional offset of the pattern arises.

On the other hand, as shown in FIGS. 18A and 18B, by using a silver salt photosensitive material which forms different colors when exposed at three wavelengths (e.g., R, G, B), black is exposed by UV (405 nm), red is exposed by B (450 nm) and G (532 nm), green is exposed by B (450 nm) and R (635 nm), and blue is exposed by G (532 nm) and R (635 nm) by using an exposure device having four exposure heads (R, G, B, UV). After exposure, when the photosensitive material passes through a developing liquid and is developed, in the case in which the photosensitive material is a web, all of the colors are formed simultaneously, and patterns of the respective colors are formed. However, in order to obtain high-density coloring, the thickness of the photosensitive material must be several tens of $\mu$ m, and the accuracy of pattern formation has been insufficient.

SUMMARY OF THE INVENTION

In view of the aforementioned, an object of the present invention is to provide a writing device which enables writing in two dimensions or three dimensions by a simple process and which enables highly-accurate pattern formation, and to provide a writing method using the writing device.

In order to achieve the above object, in accordance with a first aspect of the present invention, there is provided a writing device carrying out writing of a multi-layer circuit pattern or the like on a medium on which writing is carried out, the writing device comprising: at least one exposure head and/or at least one discharging head; and a moving device which moves, relatively and in a predetermined direction, the heads and the medium on which writing is carried out, wherein the heads are disposed substantially parallel to the predetermined direction.

In accordance with a second aspect of the present invention, there is provided a writing method which is used in a writing device which has at least one exposure head and/or at least one discharging head, the heads being disposed substantially parallel to a predetermined direction, the method comprising the steps of: providing a medium on which writing is carried out; moving, relatively and in a predetermined direction, the heads and the medium on which writing is carried out; as the relative movement is carried out, discharging a functional material from one of the discharging heads onto the medium on which writing is carried out; and carrying out exposure.

BRIEF DESCRIPTION OF THE DRAWINGS

FIG. 2 is an explanatory diagram showing a position adjusting method of an exposure head and a discharging head provided at the writing device relating to the embodiment of the present invention.

FIG. 3 is a perspective view showing the schematic structure of irradiating heads of the exposure head of the writing device relating to the embodiment of the present invention.

FIG. 4A is a subscanning direction sectional view, taken along an optical axis and showing the structure of the irradiating head shown in FIG. 3, and FIG. 4B is a side view of FIG. 4A.

FIG. 7 is a plan view showing scan lines of laser light of the exposure head provided at the writing device relating to the embodiment of the present invention.

FIGS. 8A through 8H are sectional views showing a method of forming a circuit board by the exposure head and the discharging heads provided at the writing device relating to the embodiment of the present invention.

FIGS. 9A and 9B are sectional views showing a method of forming a circuit board by an exposure head and discharging heads of a modified example of the writing device relating to the embodiment of the present invention.

FIGS. 12A through 12F are sectional views showing a method of forming a circuit board by an exposure head and discharging heads of a modified example of the writing device relating to the embodiment of the present invention.

FIGS. 13A through 13C are sectional views showing a method of forming a circuit board by an exposure head and discharging heads of a modified example of the writing device relating to the embodiment of the present invention.

FIG. 16 is a perspective view showing another modified example of the writing device relating to the embodiment of the present invention, and is a block diagram for explaining operation of the writing device.

DESCRIPTION OF THE PREFERRED EMBODIMENTS

A writing device relating to an embodiment of the present invention will be described hereinafter.

Figure 1:
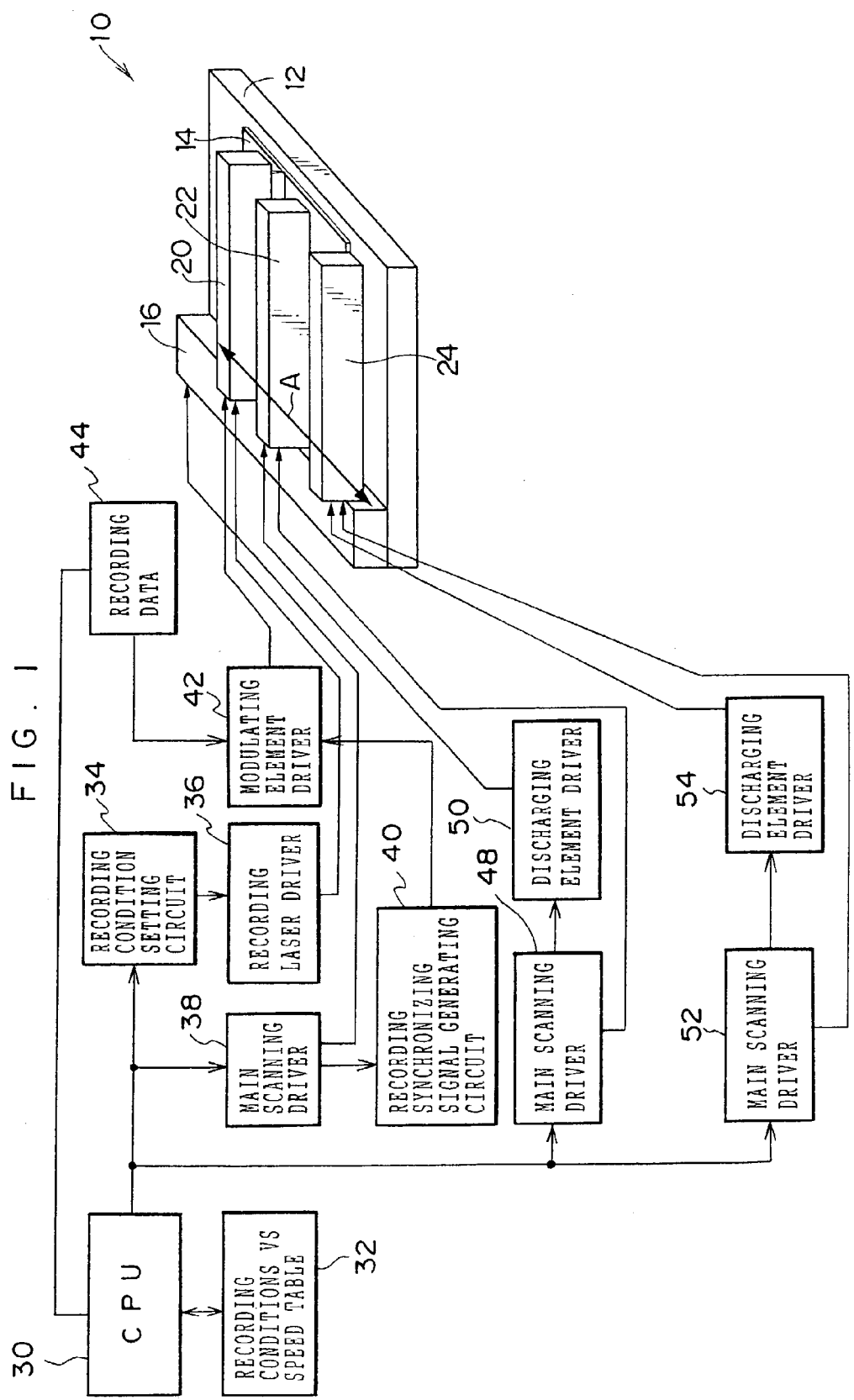
FIG. 1 is a perspective view showing a writing device relating to an embodiment of the present invention, and is a block diagram showing operation of the writing device.

As shown in FIG. 1, a substantially parallelepiped scanning stage 12 is provided at a writing device 10. A printed board 14 serving as a medium on which writing is carried out is placed on the top surface of the scanning stage 12 in a positioned state. A substantially parallelepiped head holding body 16 is provided at the writing device 10 at an end portion along the longitudinal direction of the scanning stage 12.

As shown in FIG. 2, a guide rail 18 is disposed at the head holding body 16 along the longitudinal direction of the head holding body 16. An exposure head 20 and a discharging head 22 are supported in a cantilevered manner by connecting portions 26, 28, respectively, in a state of being orthogonal to the longitudinal direction of the head holding body 16. (A discharging head 24 shown in FIG. 1 has substantially the same structure as the discharging head 22. Thus, illustration and description of the discharging head 24 will be omitted.) The exposure head 20 and the discharging head 22 are movable in the direction of arrow A along the guide rail 18. (Hereinafter, the direction of arrow A will be called the "main scanning direction".)

The connecting portions 26, 28 of the exposure head 20 and the discharging head 22 are linear motors (not shown). Due to the linear motors being driven by an unillustrated driving device, the exposure head 20 and the discharging head 22 move along the guide rail 18 via the connecting portions 26, 28.

On the other hand, as shown in FIG. 1, the control section of the writing device 10 has a CPU (central processing unit) 30. When an operation command is inputted to the CPU 30 from an unillustrated input device, in order to determine the contents of control (such as the level of the laser energy and the like) in accordance with the operational conditions such as the scanning speed of the exposure head 20 and the like, the set value of the level of the laser energy or the like which is suited to the operational conditions is read from a table 32 which is stored in a memory connected to the CPU 30 and in which is recorded the relationship between the head feeding speed and the recording conditions.

A control signal, which is for controlling the exposure head 20 on the basis of the set value of the level of the laser energy or the like which was read from the table 32, is transmitted to a recording condition setting circuit 34. The recording condition setting circuit 34 transmits a control signal, which includes the set value relating to the laser energy, to a recording laser driver 36. Laser light can be emitted due to the recording condition setting circuit 34 driving a fiber array light source 66 (see FIGS. 4A and 4B) of the exposure head 20 via the recording laser driver 36.

The CPU 30 transmits, to a main scanning driver 38 for the exposure head 20, a control signal for controlling the exposure head 20 on the basis of the set value of the level of the laser energy or the like which was read from the table 32. The main scanning driver 38 for the exposure head 20 transmits, to a driving device provided at the head holding body 16, a control signal for moving the exposure head 20, and makes the exposure head 20 move in the main scanning direction.

The main scanning driver 38 for the exposure head 20 transmits a control signal to a recording synchronizing signal generating circuit 40, and transmits a synchronizing signal to a modulating element driver 42 via the recording synchronizing signal generating circuit 40 in order to synchronize the exposure timing of the exposure head 20 in accordance with the moving speed of the exposure head 20.

At the modulating element driver 42, recording information of a write pattern is read from recording data 44 stored in the memory of the CPU 30. The printed board 14 is exposed on the basis of the recording information of the write pattern.

The CPU 30 transmits, to a main scanning driver 48 for the discharging head 22, a control signal for controlling the discharging head 22 on the basis of the set value of the level of the laser energy or the like which was read from the table 32.

The main scanning driver 48 for the discharging head 22 transmits a control signal to the driving device which moves the discharging head 22, and makes the discharging head 22 move in the main scanning direction. The main scanning driver 48 for the discharging head 22 transmits, by an unillustrated synchronizing signal generating circuit, a synchronizing signal to a discharging element driver 50 in order to synchronize the timing for discharging a functional material filled in the discharging head 22 in accordance with the moving speed of the discharging head 22. The main scanning driver 48 for the discharging head 22 makes the functional material be discharged out onto the printed board 14 on the basis of the recording information of the recorded write pattern, by a discharging means which is an electrostatic type or the like.

The CPU 30 transmits, to the driving device for moving the discharging head 24 and via a main scanning driver 52 for the discharging head 24, a control signal for controlling the discharging head 24 on the basis of the set level of the laser energy or the like which was read from the table 32, so as to make the discharging head 24 move in the main scanning direction. The CPU 30 transmits a synchronizing signal to a discharging element driver 54 via an unillustrated synchronizing signal generating circuit. The CPU 30 makes a functional material be discharged out onto the printed board 14 on the basis of the recording information of the recorded write pattern, by a discharging means which is an electrostatic type or the like.

On the other hand, as shown in FIG. 2, a screw portion (not shown) is provided at each of the connecting portions 26, 28 which connect the exposure head 20 and the discharging heads 22, 24 so as to be movable along the guide rail 18. The positions of the connecting portions 26, 28 with respect to the guide rail 18 can be adjusted in the direction of arrow A and in the direction of arrow B which is orthogonal to the direction of arrow A.

In this way, the positions of the exposure head 20 and the discharging heads 22, 24 can be adjusted with respect to the direction of arrow A and the direction of arrow B. Specifically, a prescribed pattern is patterned on the printed board 14 by the exposure head 20 and the discharging heads 22, 24, and the difference between a target pattern and the actual pattern is measured, and position adjustment is carried out.

For example, a pattern in which three discharging lines of the discharging head 22 coincide with the exposure line of the exposure head 20 is used as the target pattern. It is observed which of the discharging lines the exposure line corresponds to, and adjustment of the position of the exposure head 20 is carried out. Conversely, the position of the discharging head 22 may be adjusted by using the exposure line as a reference.

Here, positional adjustment of the exposure head 20 and the discharging heads 22, 24 can be carried out by the screw portions provided at the connecting portions 26, 28. However, arrangement data of the modulating elements used at the exposure head 20 or the discharging elements used at the discharging heads 22, 24 may be transmitted to an unillustrated control section, and the positions of the exposure head 20 and the discharging heads 22, 24 may be adjusted automatically.

In this case, with regard to the direction of arrow A, positional adjustment of the arrow A direction positions of the exposure line and the discharging lines can be carried out by adjusting the timing of the discharging or the exposure by the synchronizing signal generating circuits.

The discharging heads 22, 24 are structured by an ink discharging system. A copper particulate resin capsule dispersed liquid, which serves as a conductive material and exhibits electrical conductivity when heated, is filled in the discharging head 22. An insulating resin dispersed liquid, which serves as an insulating material, is filled in the discharging head 24. Further, the discharging heads 22, 24 are each structured by an electrostatic system, and discharge the functional materials filled therein by static electricity to the exterior.

As shown in FIGS. 3, 4A and 4B, the exposure head 20 is formed by a plurality of irradiating heads 56. A fiber array light source 66 is provided at each irradiating head 56. The light source wavelength is 350 to 450 nm. (However, in the heat mode, the range of wavelengths is broadened, and becomes 350 to 950 nm.)

The laser light irradiated from the fiber array light source 66 is made into parallel light by a pair of combination lenses 71 forming a lens system 67. The parallel light is made incident on a pair of combination lenses 73. The combination lenses 73 have the following functions: with respect to the direction in which the laser emitting ends are arranged, the portions of the combination lenses 73 which are near to the optical axis of the lenses make the bundle of light widen, and the portions which are farther from the optical axis make the bundle of light contract, whereas with respect to the direction orthogonal to the direction in which the laser emitting ends are arranged, the combination lenses 73 transmit the light therethrough as is. The combination lenses 73 correct the laser light such that the light amount distribution thereof becomes uniform.

The laser light, whose light amount distribution has been corrected to be uniform by the combination lenses 73, is converged by a condensing lens 75. Via a reflecting mirror 69, the light is made incident on a digital micromirror device 68 (hereinafter, "DMD 68") which serves as a spatial light modulator which modulates the incident light beam for each pixel in accordance with image data.

Figure 5:
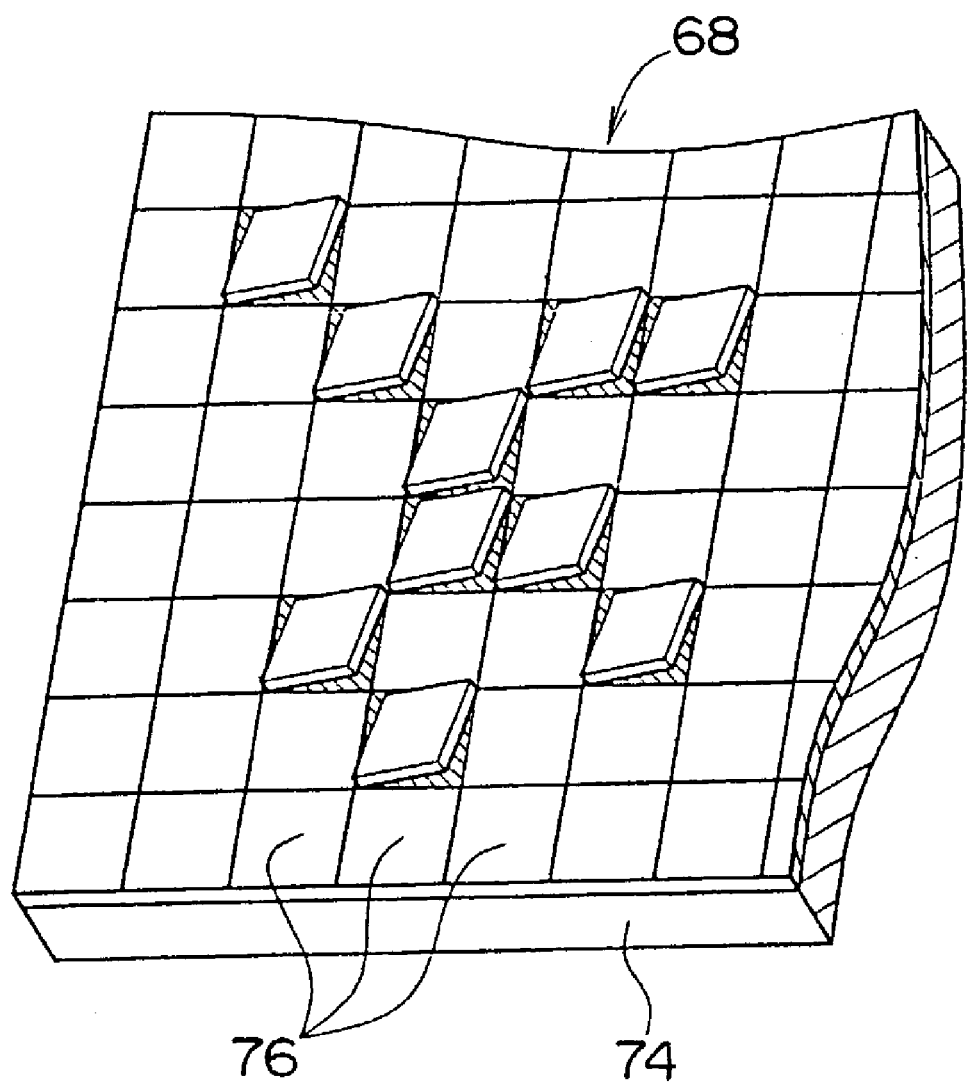
FIG. 5 is a partial enlarged view showing the structure of a DMD forming the exposure head of the writing device relating to the embodiment of the present invention.

The laser light which is incident on the DMD 68 is imaged on the printed board 14 by a lens system 70, 72. Here, as shown in FIG. 5, the DMD 68 is a mirror device in which micromirrors 76 are supported by supports on an SRAM cell (memory cell) 74, and a large number (e.g., 600×800) micromirrors forming pixels are arrayed in a lattice form.

The micromirror 76 supported at the uppermost portion of the support is provided for each pixel. A material having high reflectance such as aluminum or the like is deposited on the surface of the micromirror 76, such that the reflectance of the micromirror 76 is 90% or more.

The SRAM cell 74 of a CMOS of a silicon gate, which is fabricated on a usual semiconductor memory production line, is disposed directly beneath the micromirrors 76 via the supports which each include a hinge and a yoke. A monolithic structure is formed on the whole.

When a digital signal is written to the SRAM cell 74 of the DMD 68, the micromirrors 76 which are supported on the supports are tilted within a range of $\pm\alpha°$ (e.g., $\pm10°$) with respect to the substrate on which the DMD 68 is disposed and around a diagonal line.

Figure 6A:
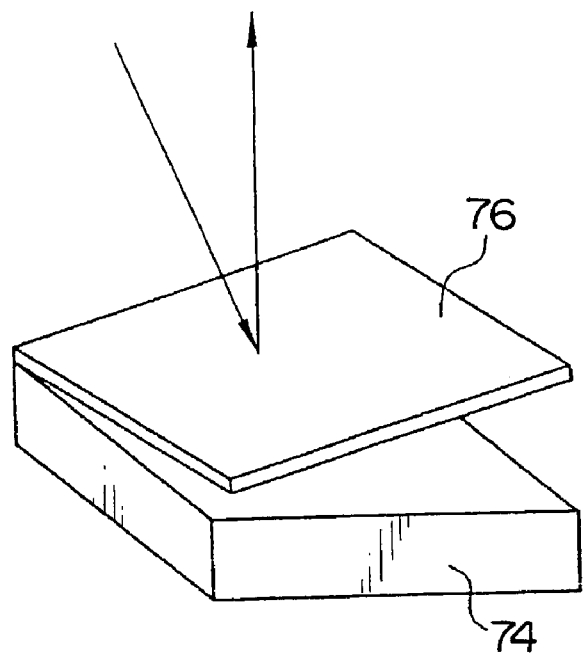
FIGS. 6A and 6B are explanatory diagrams for explaining operation of the DMD.
Figure 6B:
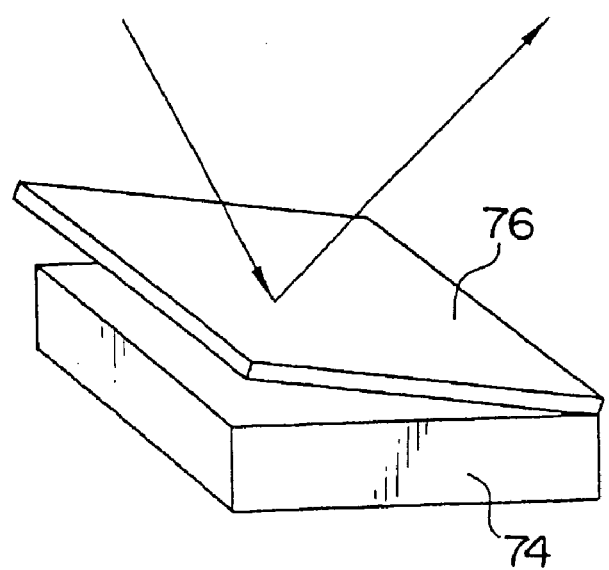

Here, FIG. 6A shows a state in which the micromirror 76 is tilted by $+\alpha°$ which is the on state. FIGS. 6B shows a state in which the micromirror 76 is tilted by $-\alpha°$ which is the off state. By controlling the inclinations of the micromirrors 76 at the respective pixels of the DMD 68 in accordance with the image signal, the light incident on the DMD 68 is reflected in the directions of tilting of the respective micromirrors 76.

FIG. 5 is a view in which one portion of the DMD 68 is enlarged, and shows an example of a state in which the micromirrors 76 are controlled to $+\alpha°$ or $-\alpha°$. The on/off control of each micromirror 76 is carried out by an unillustrated controller connected to the DMD 68. Note that a light absorbing body (not illustrated) is disposed in the direction in which the light beams are reflected by the micromirrors 76 which are in the off state.

Further, as shown in FIG. 7, a large number (e.g., 800 columns×600 rows) of the micromirrors 76 are arranged at the DMD 68. When the DMDs 68 are disposed in a staggered form and are inclined slightly so as to form a predetermined angle (e.g., 0.1° to 5°) with respect to the main scanning direction (the direction of arrow A), and the exposure head 20 is main-scanned, adjacent exposed portions overlap slightly.

In this way, even if the position of the DMD 68 is slightly offset, this offset can be absorbed, and highly accurate exposure can be realized. Further, by turning either one of the micromirrors 76 at the overlapping portion off, it is possible to avoid multiple exposure.

Next, operation of the writing device relating to the embodiment of the present invention will be described.

Figure 8A:
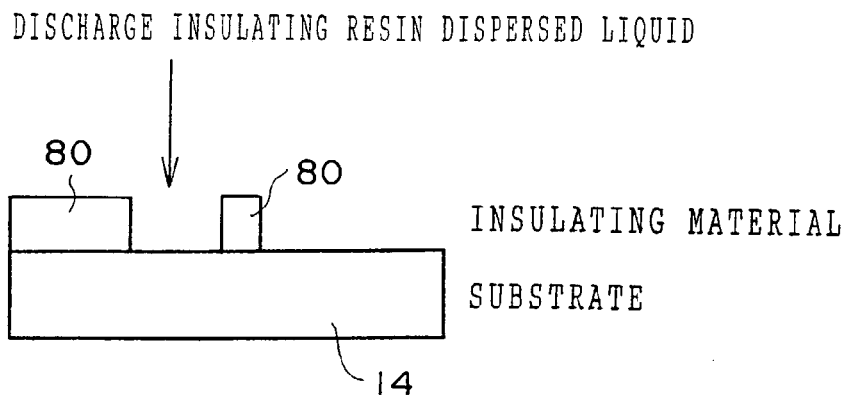

As shown in FIG. 8A, an insulating resin dispersed liquid 80 is discharged onto the printed board 14, which is positioned on the top surface of the scanning stage 12 (see FIG. 1), by the insulating material discharging head 24 (see FIG. 1) on the basis of the recording information of the recorded write pattern.

Figure 8B:
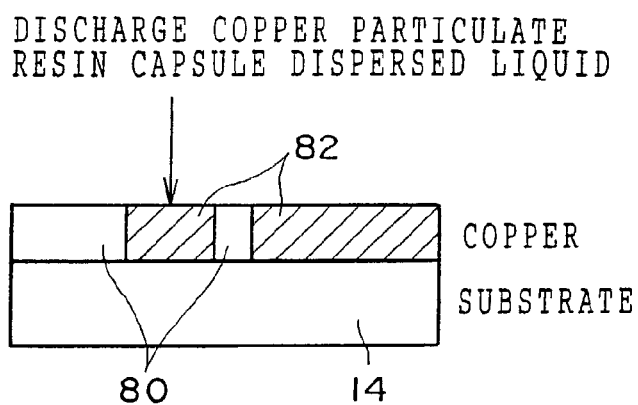

Next, as shown in FIG. 8B, a copper particulate resin capsule dispersed liquid 82 serving as a conductive material is discharged on the basis of the recording information of the recorded write pattern, by the conductive material discharging head 22 (see FIG. 1) in which is filled a conductive material which exhibits electrical conductivity upon heating. (Note that the insulating resin dispersed liquid 80 may be discharged after the copper particulate resin capsule dispersed liquid 82 is discharged on the printed board 14.)

Figure 8C:
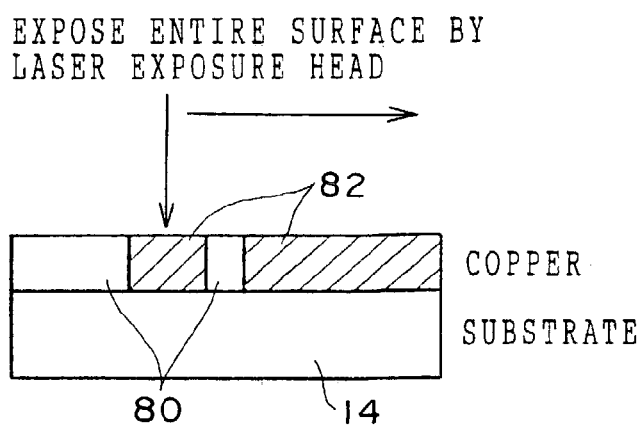

Then, as shown in FIG. 8C, the entire surface of the printed board 14 is exposed by the exposure head 20 (see FIG. 1) having a heating function. The copper particulate resin capsule dispersed liquid 82 and the insulating resin dispersed liquid 80 are thereby hardened.

Here, depending on the type of the insulating resin dispersed liquid, the micromirrors 76 (see FIG. 5) of the DMD 68 (see FIG. 5) forming the exposure head 20 may be controlled so as to expose only the regions where the copper particulate resin capsule dispersed liquid 82 has been discharged. (Note that it is possible to carry out local exposure only at the necessary regions, and it is possible to expose a region which is slightly wider than the region where the copper particulate resin capsule dispersed liquid 82 has been discharged.) In this case, the printed board 14 can be exposed locally, and only the surface thereof is heated, which is different than in the case of thermoannealing. Thus, thermal expansion/contraction of the printed board 14 is avoided, and the heat-resistant temperature of the printed board 14 can be lowered. Further, the time can be shortened as compared with a case in which thermoannealing is carried out.

Moreover, in thermoannealing, there is the problem that the resistance value cannot be sufficiently lowered (resistance value: 5 to $8 \times 10^{-5}$ Ωcm) because the resin within the copper particulate resin capsule dispersed liquid 82 does not completely transpire or because gaps remain between the copper particulates. However, in the case of laser annealing, there are resistance values (3 to $5 \times 10^{-6}$ Ωcm) which are equivalent to those of a copper wiring pattern formed by usual plating. Therefore, laser annealing can be widely used in general circuit board applications.

Figure 8D:
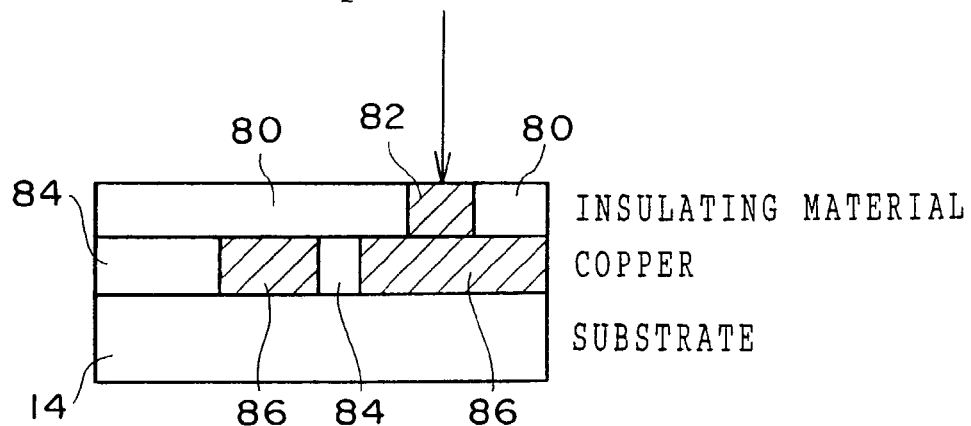
Figure 8E:
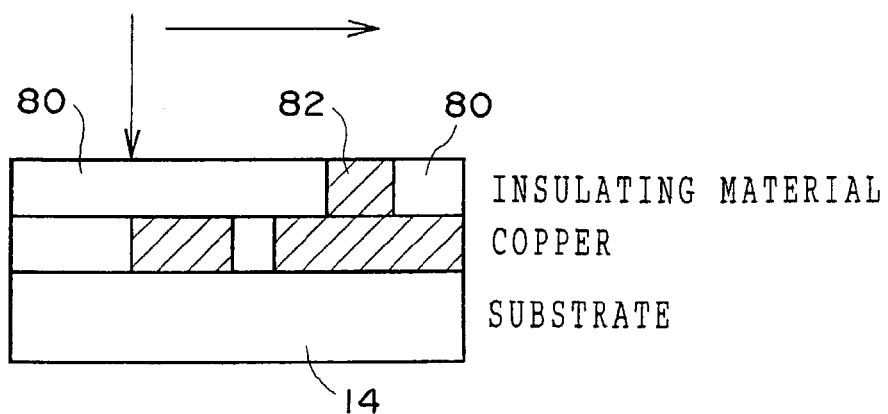

Next, as shown in FIG. 8D, the insulating resin dispersed liquid 80 is discharged by the insulating material discharging head 24 and the copper particulate resin capsule dispersed liquid 82 is discharged by the conductive material discharging head 22, onto an insulating layer 84 and a copper particulate layer 86 which have been formed by the copper particulate resin capsule dispersed liquid 82 and the insulating resin dispersed liquid 80 hardening. Thereafter, as shown in FIG. 8E, the entire printed board 14 is exposed by the exposure head 20, and the copper particulate resin capsule dispersed liquid 82 and the insulating material resin dispersed liquid 80 are hardened.

Figure 8F:
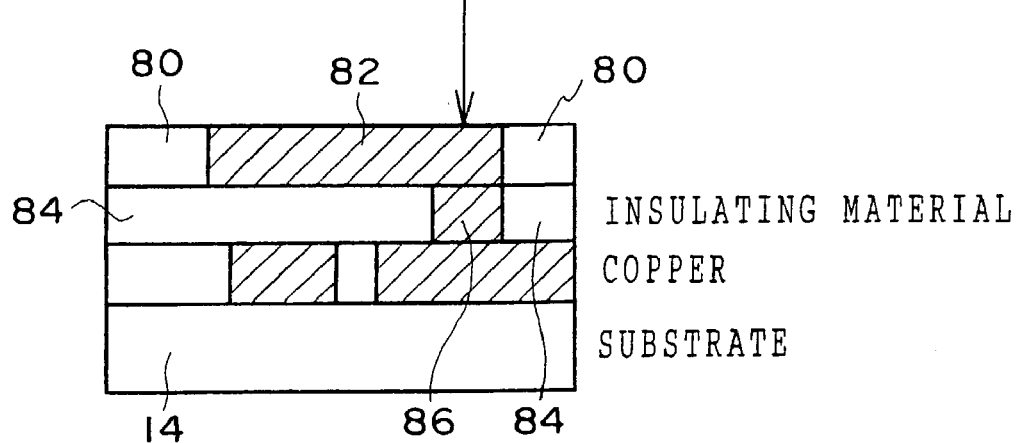
Figure 8G:
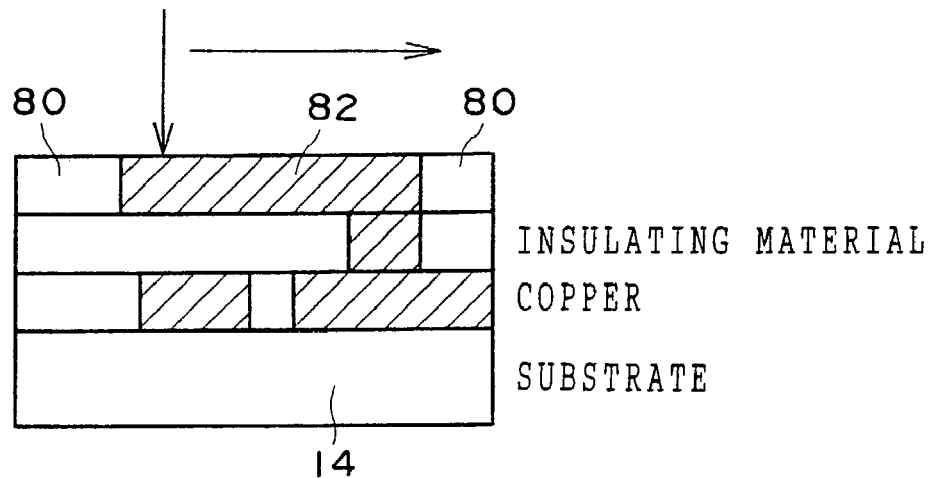

Then, as shown in FIG. 8F, the insulating resin dispersed liquid 80 is discharged by the insulating material discharging head 24 and the copper particulate resin capsule dispersed liquid 82 is discharged by the conductive material discharging head 22, onto the insulating layer 84 and the copper particulate layer 86. Thereafter, as shown in FIG. 8G, the entire surface of the printed board 14 is exposed by the exposure head 20, and the copper particulate resin capsule dispersed liquid 82 and the insulating resin dispersed liquid 80 are hardened.

Next, as shown in FIG. 8H, the insulating material resin dispersed liquid 80 is discharged by the insulating material discharging head 24 onto the insulating layer 84 and the copper particulate layer 86 such that the surface of the printed board 14 is covered by the insulating resin, except for the regions where solder is to be applied and the electrodes are to be led out from an external circuit board.

In this way, a material which exhibits electrical conductivity by heating is discharged onto the printed board 14 by the discharging head 22 (a so-called coated state in which the material is discharged onto the entire surface of the printed board 14 may be used). Thereafter, by carrying out annealing (on the entire surface or locally) by the exposure head having a heating function, conductive patterning can be carried out easily, and a multi-layer circuit board 88 can be formed easily.

In the present embodiment, as shown in FIG. 1, by disposing the exposure head 20 and the discharging heads 22, 24 at the same scanning stage 12, the processes can be simplified, the time between patternings can be shortened, and pattern formation can be made to be more rapid, as compared with a case in which a scanning stage is provided for each head.

Moreover, by forming a circuit pattern on the printed board 14 at the same scanning stage 12, positional offset of the exposure head 20 and the discharging heads 22, 24 with respect to the printed board 14 does not arise, and therefore, it is easy to increase the density of the pattern.

Thus, pattern formation can be carried out even in the case of a mechanism in which there is very little leeway of time between patternings, e.g., a case in which the functional material such as an insulating material or a conductive material or the like is discharged, and thereafter, must be hardened before it deforms. Moreover, it is possible to harden the functional material before the functional material flows, and a highly-precise pattern is formed.

There is no fear that the dimensions of the pattern will change due to conveying between the respective scanning stages 12 or due to the passage of the time required for movement between patternings. In addition, because there is no need for a wasteful material which is ultimately removed as in the case of a photoresist, costs can be decreased. Moreover, because the process for coating the photoresist can be eliminated, the number of processes can be decreased.

Further, by placing the exposure head 20 and the discharging heads 22, 24 on the same scanning stage, as compared with a case in which a scanning stage is provided for each head, the space required for placement of the entire device needed for forming the circuit pattern can be reduced, and costs and the amount of consumed electric power as well can be reduced.

Note that, in the present embodiment, the exposure head 20 for annealing using a DMD as a light modulating device, the electrostatic type discharging head 22 discharging the copper particulate resin capsule dispersed liquid 82, and the electrostatic type discharging head 24 discharging the insulating resin dispersed liquid 80, are provided at the scanning stage 12. However, the present invention is not limited to this embodiment.

For example, the irradiating head equipped with the DMD was described as the light modulating device of the exposure head. However, for example, also when an MEMS (micro electro mechanical system) type spatial light modulator (SLM), or a spatial light modulator other than a MEMS type spatial light modulator such as an optical element modulating transmitted light by an electrooptical effect (a PLZT element), a liquid crystal light shutter (FLC) or the like is used, the modulating speed per pixel and per scan line can be made faster by using some of the pixel portions as opposed to all of the pixel portions arrayed on the substrate. Thus, the same effects can be achieved.

Note that MEMS is a generic name for microsized sensors formed by a micro-machining technique based on an IC manufacturing process, actuators, and fine systems in which control circuits are integrated. A MEMS type spatial light modulator means a spatial light modulator which is driven by electromechanical action using static electricity.

Further, examples of the photosensitive material are photoresists, diazos, photopolymers, particulate dispersed materials (resins, dielectrics, conductive materials, and capsule-structured particles thereof), heat crystallized materials, heat-sensitive materials, heat transfer materials, molecule diffused materials (so-called sublimating-type heat transfer materials), and the like. Examples of the form of the photosensitive material are film, liquid, solid, particulate, particulate dispersed liquid, particulate film-forming film (substrate) and the like. However, it suffices for so-called patterning (an etching mask, a plating mask, water-repellant/hydrophilic, indentations and recesses, heat annealing, heat transfer, heat reaction, ablation, and the like) to be formed as two-dimensional writing by an exposure head, and it suffices for a solid form formed by photo-curing, powder sintering, heat melting, or thermosetting to be formed as three-dimensional writing (a structure in which two-dimensional writing is repeated plural times).

Examples of the ink jet head forming the discharging head are the on-demand nozzle type (piezo, electrostatic membrane, thermal, and the like), the continuous type (electric field deflection, heat deflection, or the like), and the on-demand nozzleless type (ultrasonic, electrostatic discharging, and the like). Examples of the discharged material are photoreactive liquids, particulate dispersed liquids (resins, dielectrics, conductive bodies, heat crystallized materials, heat-sensitive materials, heat melting materials, molecule diffused materials (so-called sublimating-type heat transfer materials), catalysts, yeast, bacteria, DNA, chemically reactive chemicals, and the like, as well as capsule-structured particles thereof), heat melting liquids (wax and the like), chemically reactive liquids, catalyst solutions, surface modifying liquids, and the like.

It suffices for patterning (an etching mask, a plating mask, water-repellant/hydrophilic, indentations and recesses) to be formed as two-dimensional writing by the discharging head, and it suffices for a solid form formed by melting by heat and hardening by cooling, or by photo-curing, powder sintering, or thermosetting to be formed as three-dimensional writing by the discharging head.

Specifically, a conductive particulate containing liquid discharging head and an exposure head may be used. As shown in FIG. 9A, a liquid 92 containing conductive particulates is discharged on the entire surface of a glass substrate 90 by a conductive particulate containing liquid discharging head. Next, as shown in FIG. 9B, an insulating material, which is coated by a liquid containing conductive particles, is annealed in a necessary conductive pattern form by the exposure head. In this way, a pattern 96 of a conductive film is formed, and a circuit board 98 is formed.

Here, particulates, in which particulates of copper, silver, gold or the like which are 10 nm to 10 $\mu$m are covered by an insulating material, can be used as the conductive particulates.

Figure 10A:
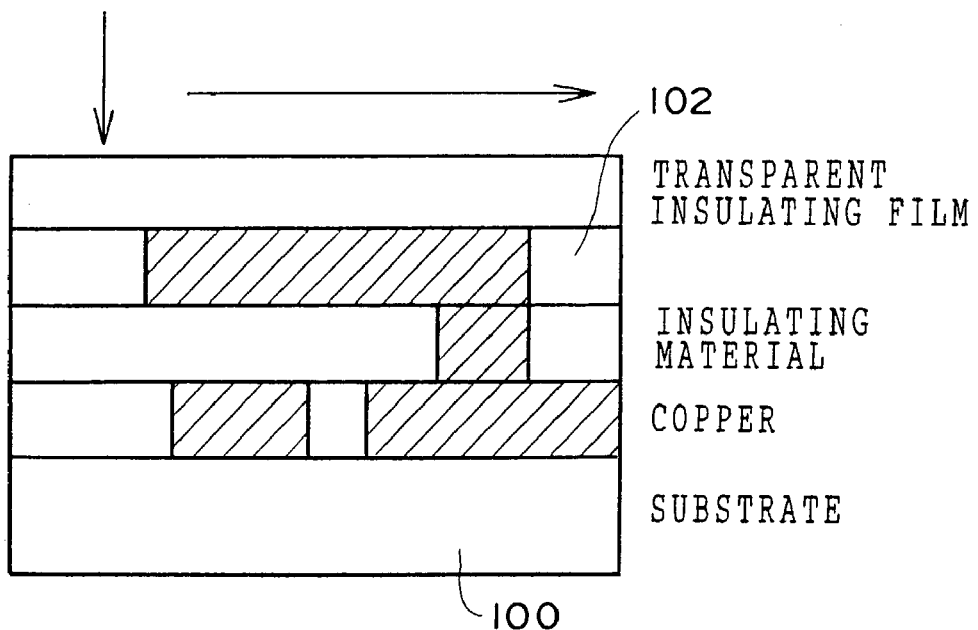
FIGS. 10A and 10B are sectional views showing a method of forming a circuit board by an exposure head and discharging heads of a modified example of the writing device relating to the embodiment of the present invention.
Figure 10B:
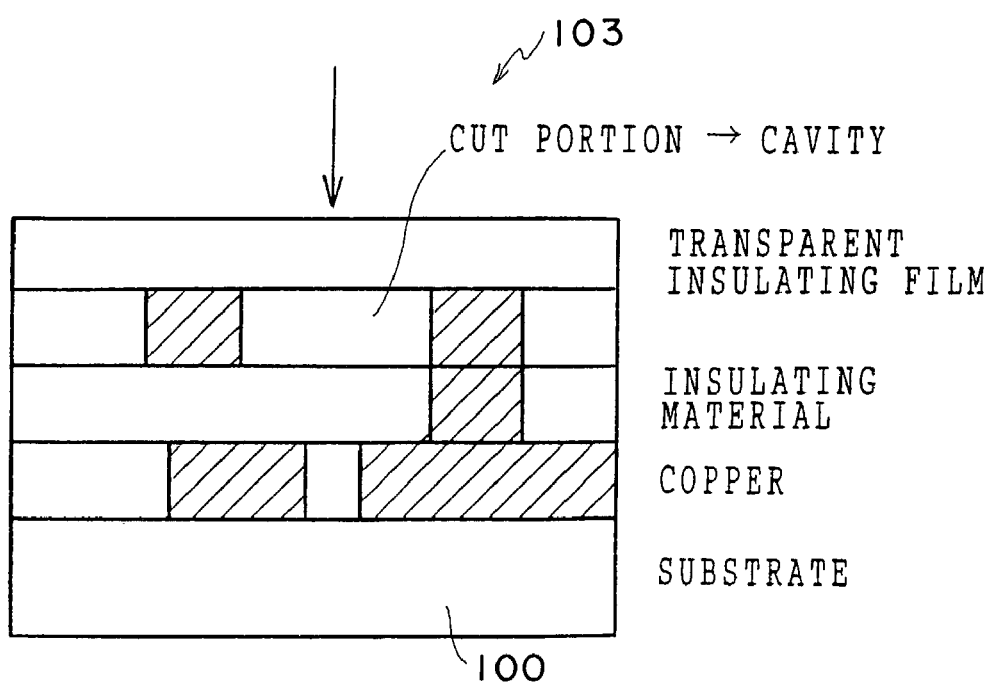

Further, an insulating film discharging head and a circuit cutting pulse laser exposure head may be used. As shown in FIG. 10A, a transparent insulating film is discharged on the entire surface of a conductive film 102 which is the outermost layer of a printed board 100 by an insulating film discharging head. This transparent insulating film is exposed by an exposure head having a wavelength which can pass through the transparent insulating film but is absorbed by a conductive film formed by plating or a conductive film discharging head. In this way, as shown in FIG. 10B, a circuit board 103, in which the circuit pattern of the conductive film 102 is cut and a cavity is formed, is formed.

At the circuit board 103, it is possible to change the circuit pattern which does not appear at the surface, and the circuit pattern can be heated in a state in which it is not contacting air. Therefore, it is difficult for the conductive film material at the periphery of the cut portion to oxidize.

Moreover, by using an insulating film discharging head, a marking ink discharging head, or a pulse laser marking exposure head, formation of a mark such as a number, a bar code, an alignment mark or the like can be carried out by the exposure head or the discharging head before the insulating film of the outermost layer is formed.

Because a mark is formed before the insulating film of the outermost layer is formed, the mark is not directly exposed at the surface, and it is possible to prevent the mark from being illicitly tampered with or from being removed. Moreover, because each layer can be marked with different contents, it is possible to prevent mistakes in the inspection conditions when the circuit is different at each layer, and it is possible to prevent mistakes in packaging when the circuit board is packaged in a final product.

Figure 11A:
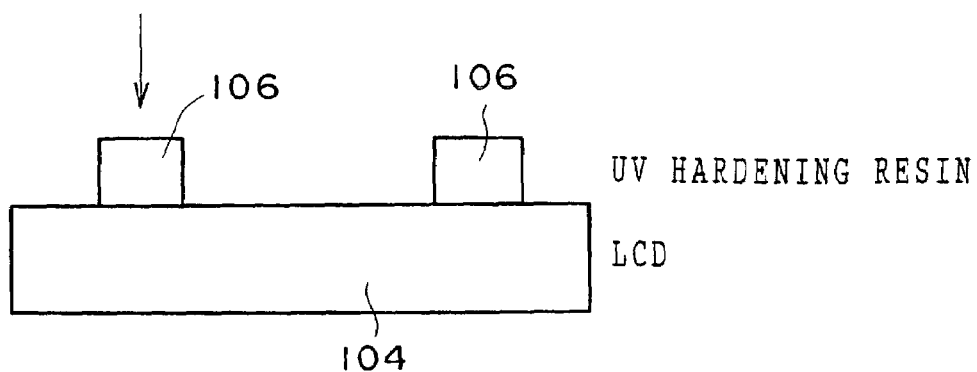
FIGS. 11A and 11B are sectional views showing a method of forming a circuit board by an exposure head and discharging heads of a modified example of the writing device relating to the embodiment of the present invention.
Figure 11B:
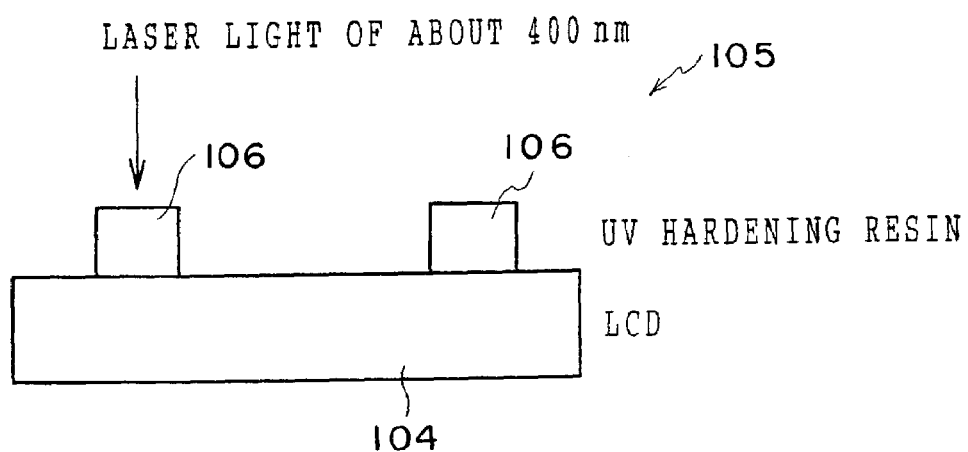

Further, a spacer structuring material discharging head and a laser exposure head for hardening may be used. As shown in FIG. 11A, spacers 106 for making the glass intervals of an LCD 104 uniform are discharged by the spacer structuring material discharging head. Thereafter, as shown in FIG. 11B, only the peripheries of corresponding positions of the spacers 106 are irradiated by the exposure head (if the material is a photo-curing type material, an ultraviolet laser of 350 to 450 nm is used as the light source, and if the material is a thermosetting type material, a high power laser of 350 to 950 nm is used as the light source), such that the spacers 106 are hardened. A substrate 105 is thereby formed.

In the substrate 105, the precision of the heights of the spacers 106 is improved, and the strength of the spacers 106 also can be improved. In this way, the present invention can also be applied to spacers for bumps of wafer level flip-chips.

Further, a photopolymer discharging head and an exposure head for hardening may be used. As shown in FIG. 12A, a photopolymer is discharged in the form of a pattern of one layer, by the photopolymer discharging head on the top surface of a stand 110 which is provided so as to be able to be raised and lowered. Next, as shown in FIG. 12B, light of 350 to 450 nm is irradiated by the exposure head and the photopolymer is hardened. As shown in FIG. 12C, the stand 110 is lowered (about 50 $\mu$m), and the photopolymer discharging head and the exposure head for hardening are raised relatively by an amount corresponding to one layer. At this time, the exposure head and the photopolymer discharging head are returned to reference positions.

Then, as shown in FIG. 12D, a photopolymer is discharged in the form of a pattern of one layer by the photopolymer discharging head. Thereafter, the photopolymer is hardened by the exposure head. As shown in FIG. 12E, the stand 110 is lowered, and the photopolymer discharging head and the exposure head for hardening are raised relatively by an amount corresponding to one layer. By repeating the above-described processes plural times, as shown in FIG. 12F, a circuit board 112 is formed. As compared with a structure which cannot be hardened by light, it is possible to carry out high-strength and highly accurate formation of a solid.

Moreover, a conductive material discharging head and a pulse laser exposure head for trimming may be used. As shown in FIG. 13A, a conductive circuit (conductive material) is formed on a printed board 113 by the conductive discharging head. Thereafter, as shown in FIG. 13B, while the resistance value is measured by a resistance meter 114, the conductive circuit is shaved off (generally called "trimming") by an exposure head (a pulse laser is preferable), and the irradiation is stopped when the resistance value is the target resistance value.

Then, as shown in FIG. 13C, by covering the top surface of the printed board 113 by an insulating material, a circuit board 115 is formed. By these processes, it is possible to fabricate a highly-accurate resistor on a circuit board, and to adjust a large number of resistors at one time.

Figure 14A:
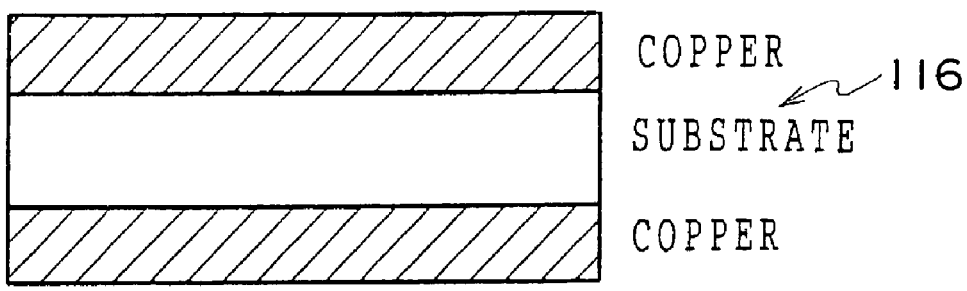
FIGS. 14A through 14K are sectional views showing a method of forming a circuit board by an exposure head and discharging heads of a modified example of the writing device relating to the embodiment of the present invention.
Figure 14B:
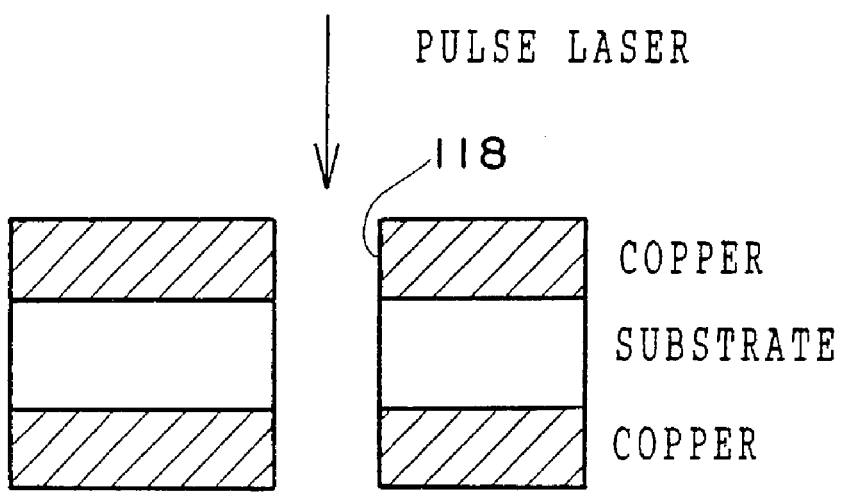

Moreover, an exposure head for a photoresist and a pulse laser exposure head for through holes, which have respectively different exposure functions, may be used. As shown in FIG. 14B, a through hole 118 is formed by the pulse laser exposure head for through holes, which is mounted to a pulse laser, in a copper plated substrate which has been copper plated as shown in FIG. 14A.

Figure 14C:
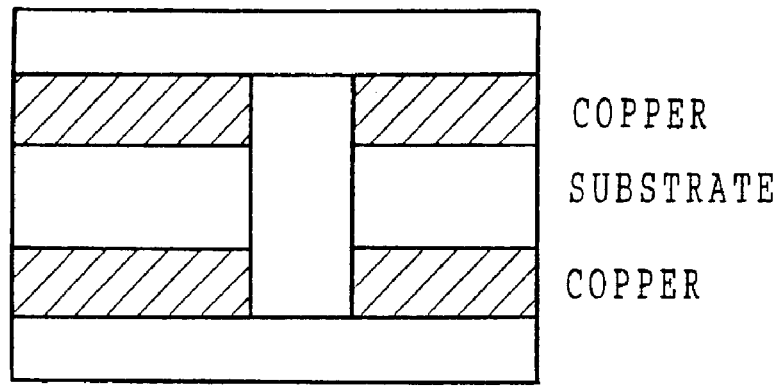
Figure 14D:
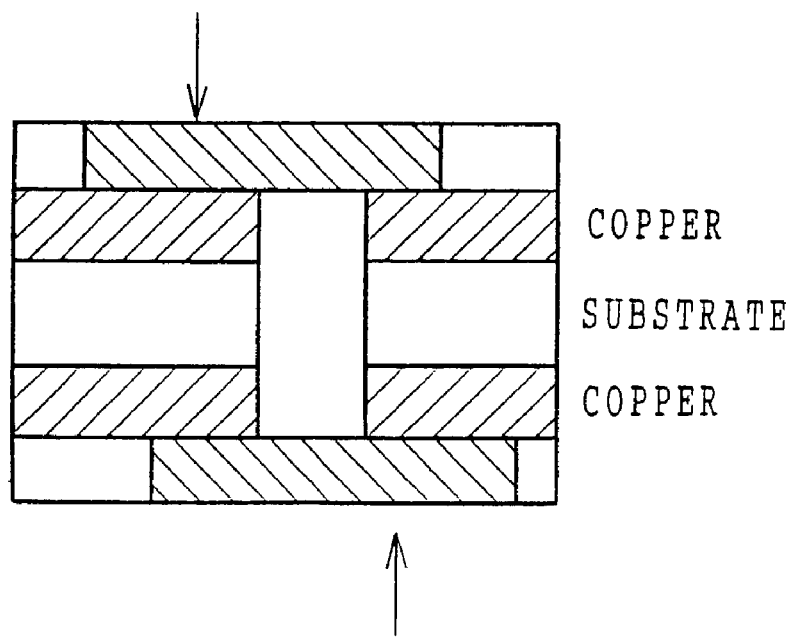
Figure 14E:
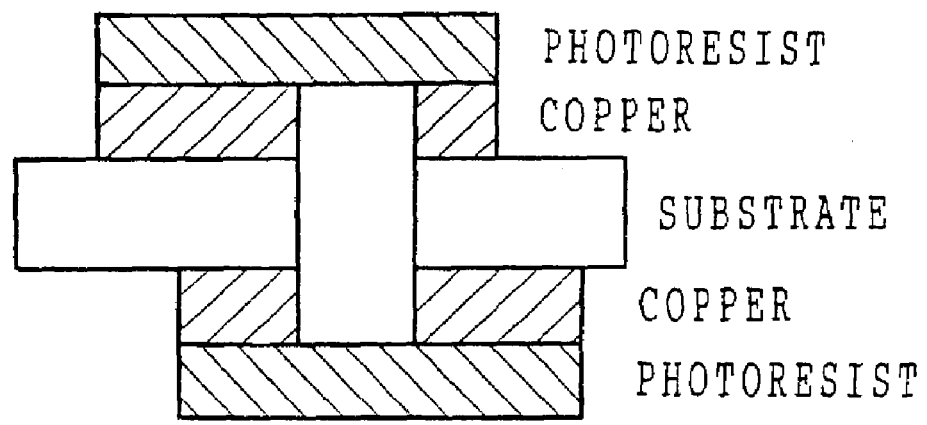

Then, as shown in FIG. 14C, both surfaces of the copper plated substrate 116 are laminated by a film-shaped photoresist. As shown in FIG. 14D, the photoresists are hardened by the exposure head for the photoresist. Thereafter, as shown in FIG. 14E, the portions of the photoresist which were not exposed by developing are removed. (Note that, here, a so-called negative type photoresist is used which becomes insoluble in a developing liquid by exposure. However, it is possible to use a so-called positive type photoresist which can dissolve easily in a developing liquid by exposure. In cases in which a positive type photoresist is used, the portions of the photoresist exposed by developing are removed.) The photoresist is removed, and the exposed copper is etched by etching.

Figure 14F:
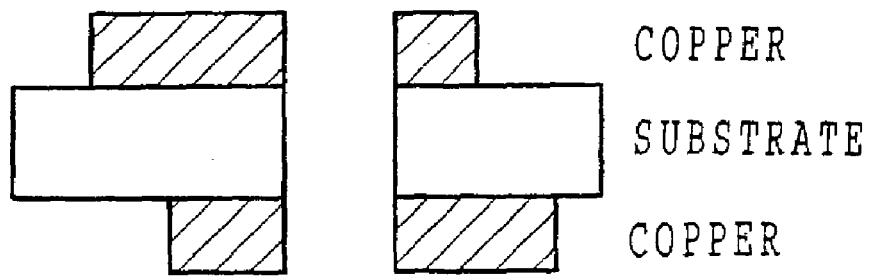
Figure 14G:
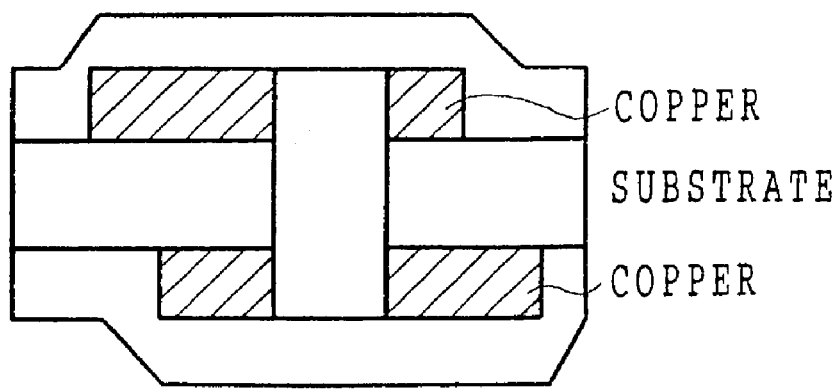
Figure 14H:
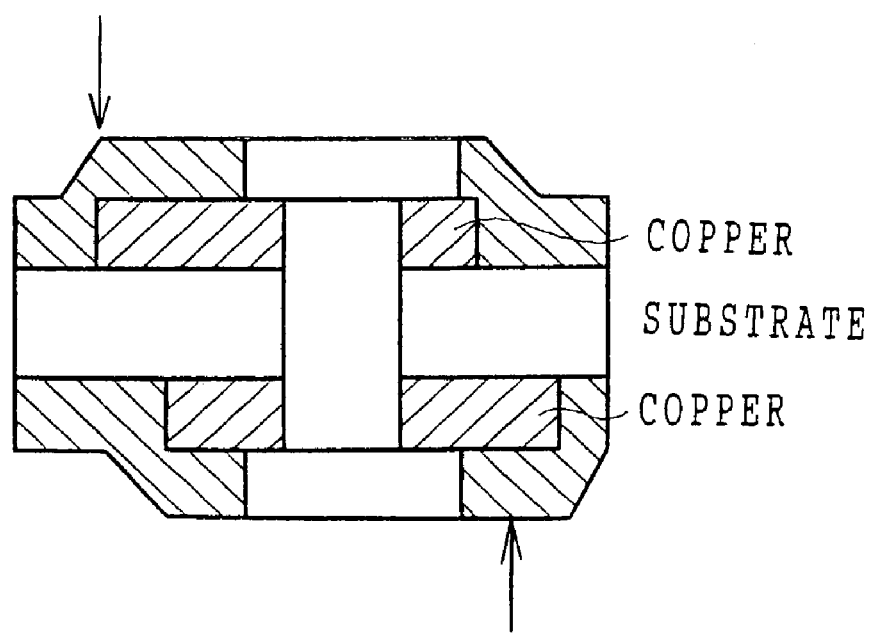
Figure 14I:
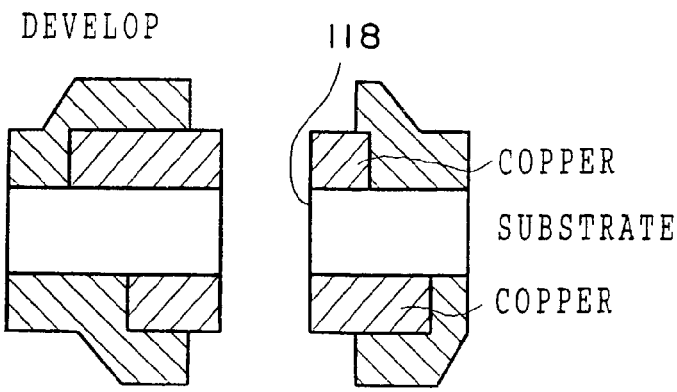

Next, as shown in FIG. 14F, the photoresist is peeled off. Subsequently, as shown in FIG. 14G, both surfaces of the copper plated substrate 116 are laminated by a film-shaped photoresist. As shown in FIG. 14H, the photoresists are hardened by the exposure head for a photoresist. Thereafter, as shown in FIG. 14I, the portions of the photoresist which were not exposed by developing are removed.

Figure 14J:
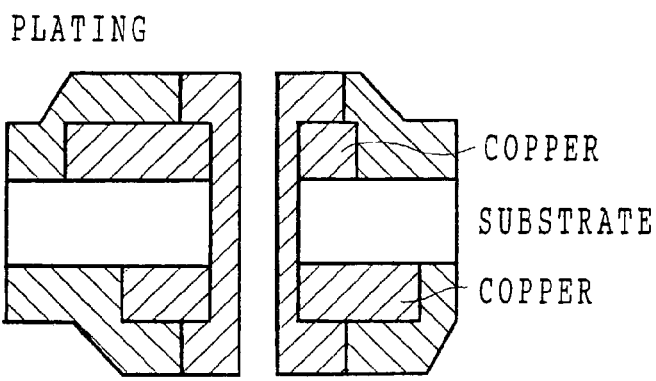
Figure 14K:
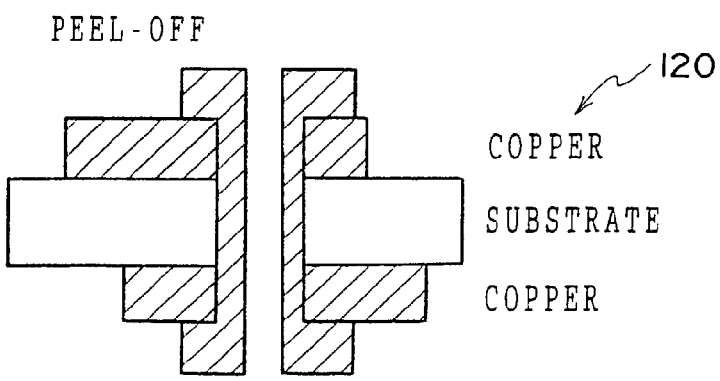

Then, as shown in FIG. 14J, the inner edge portion of the through hole 118 formed in the copper plated substrate 116 is plated. Thereafter, as shown in FIG. 14K, the photoresist is peeled off, and a circuit board 120 is formed. By forming the through hole by the same device in this way, the alignment accuracy of the hole portion can be improved.

Moreover, in the above-described embodiments, methods are described in which a pattern is formed in a state in which the printed board is placed on the scanning stage. However, a pattern may be formed by fixing the respective heads and moving the medium on which writing is carried out.

Figure 15:
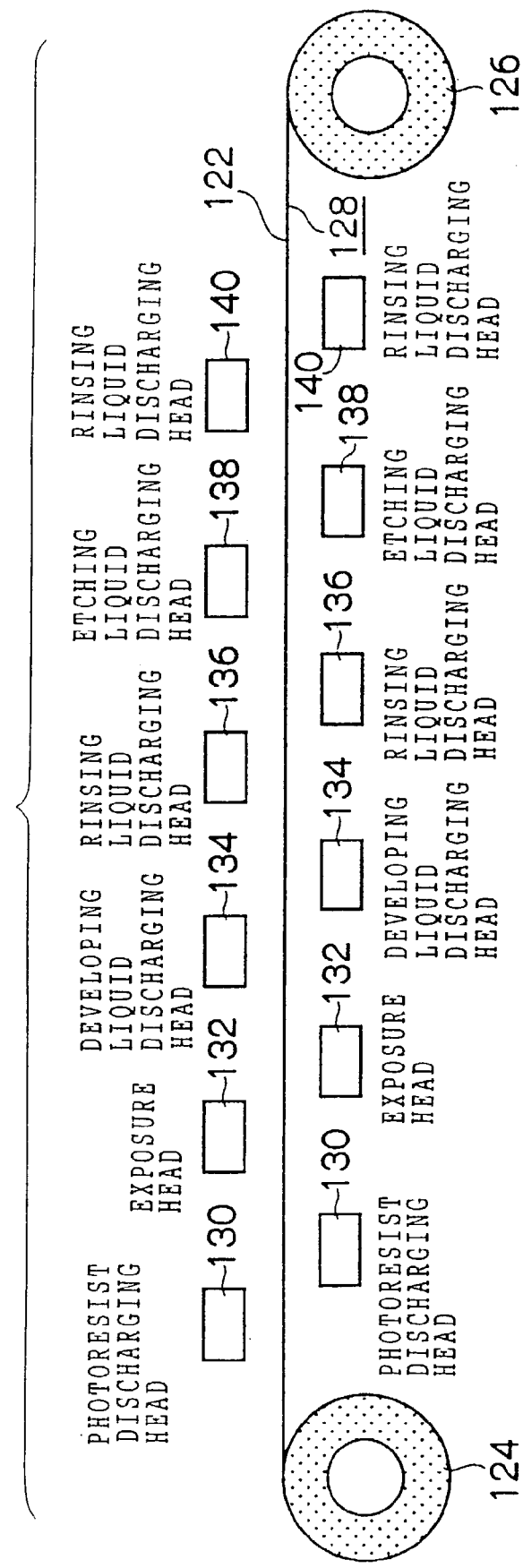
FIG. 15 is an explanatory diagram showing a modified example of the writing device relating to the embodiment of the present invention.
Figure 17A:
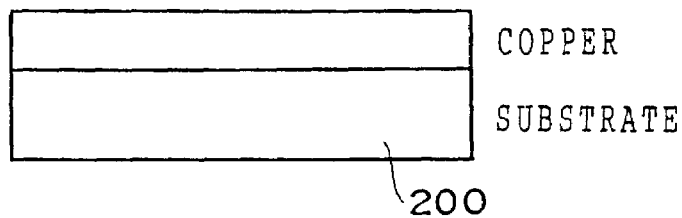
FIGS. 17A through 17O are sectional views showing a conventional method of forming a circuit board.
Figure 17B:
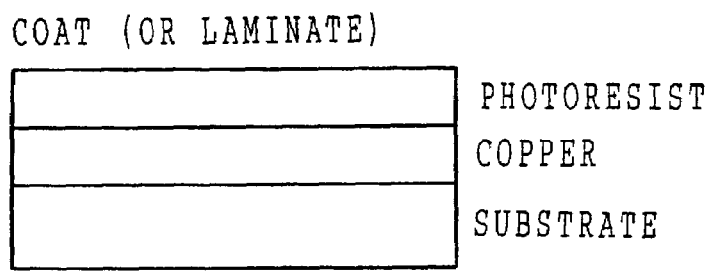
Figure 17C:
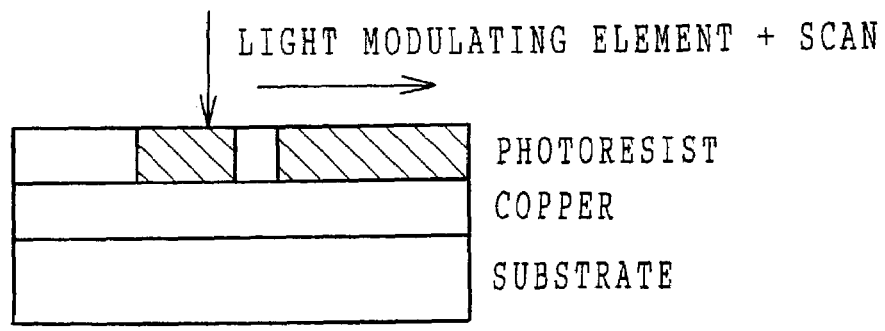
Figure 17D:
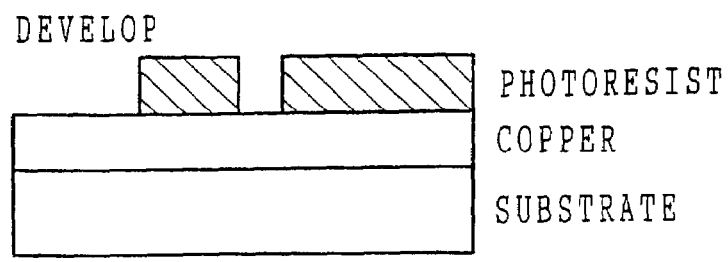
Figure 17E:
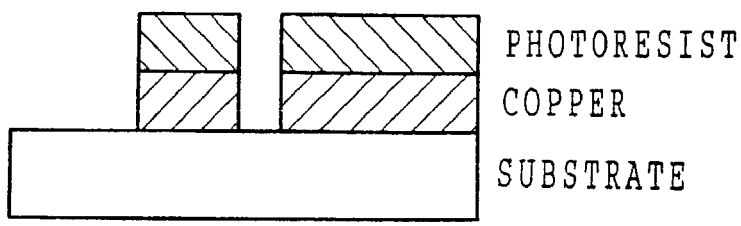
Figure 17F:
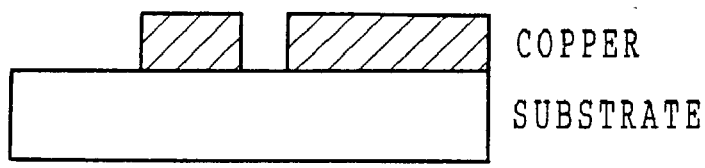
Figure 17G:
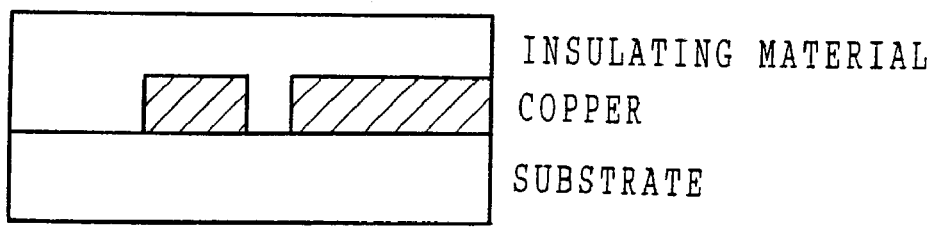
Figure 17H:
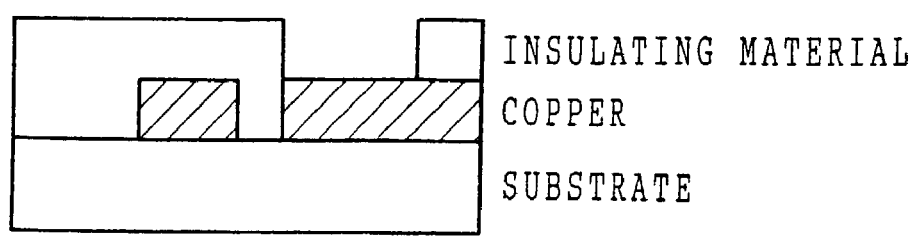
Figure 17I:
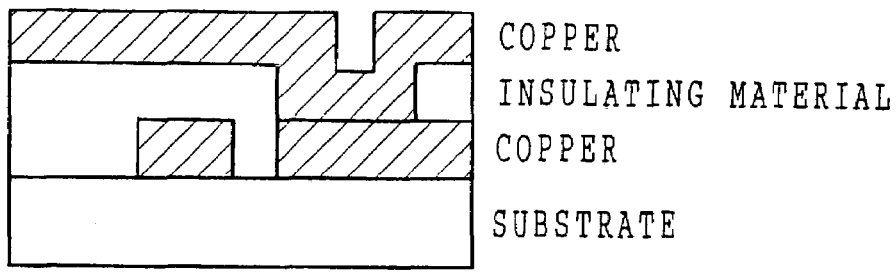
Figure 17J:
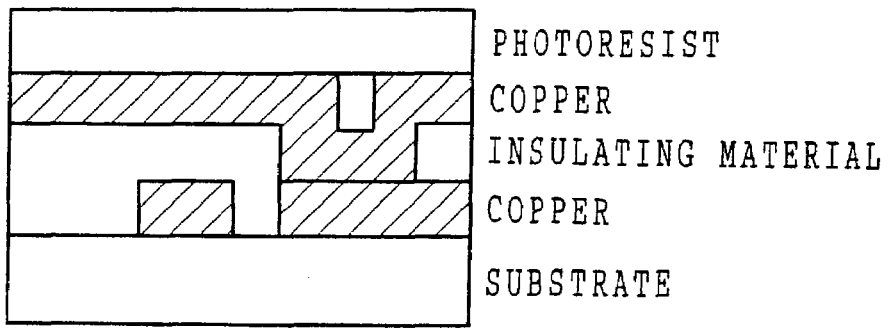
Figure 17K:
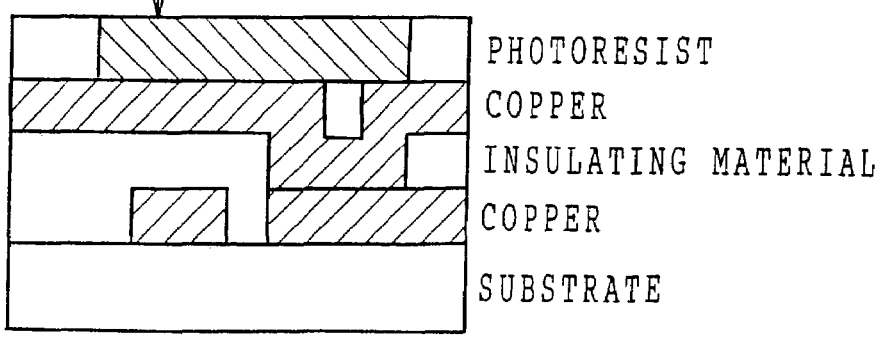
Figure 17L:
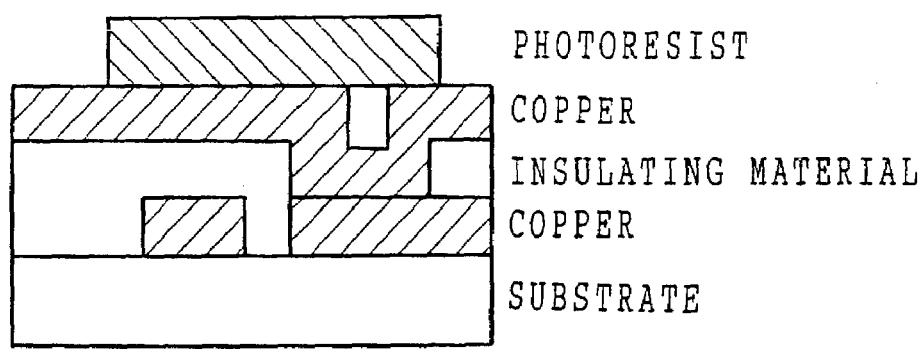
Figure 17M:
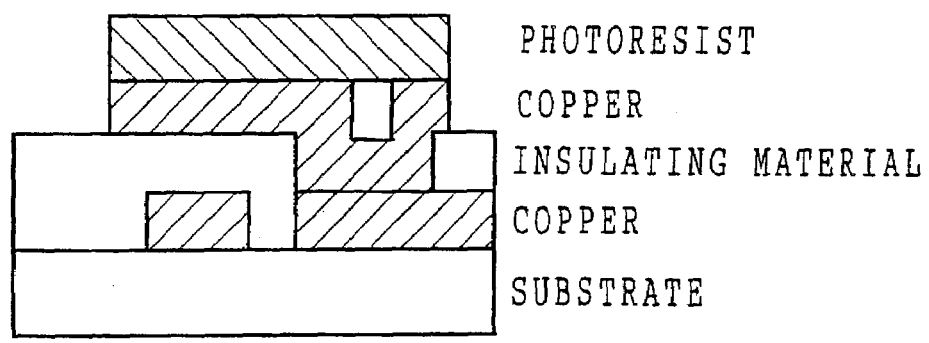
Figure 17N:
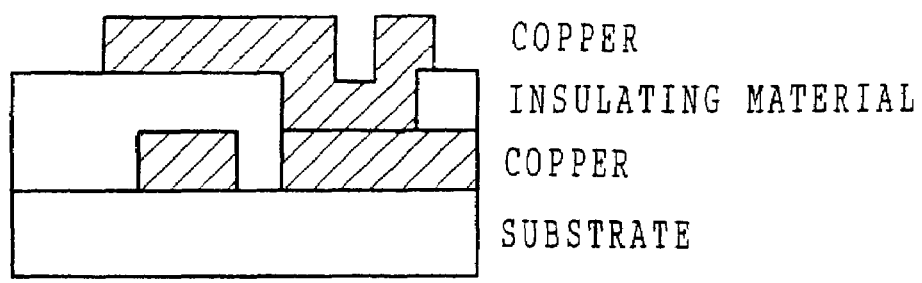
Figure 17O:
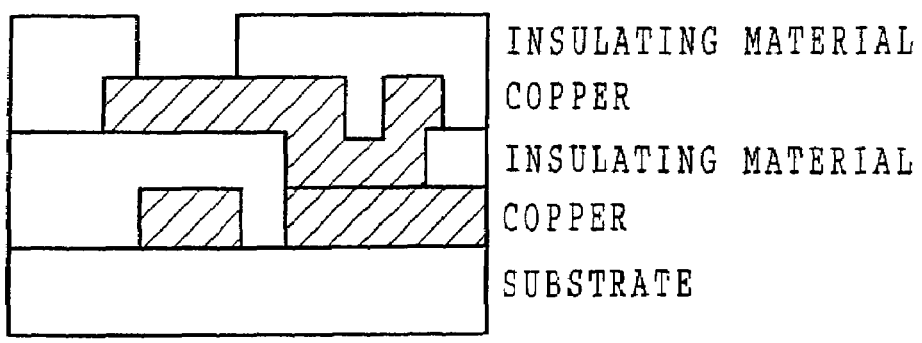
Figure 18B:
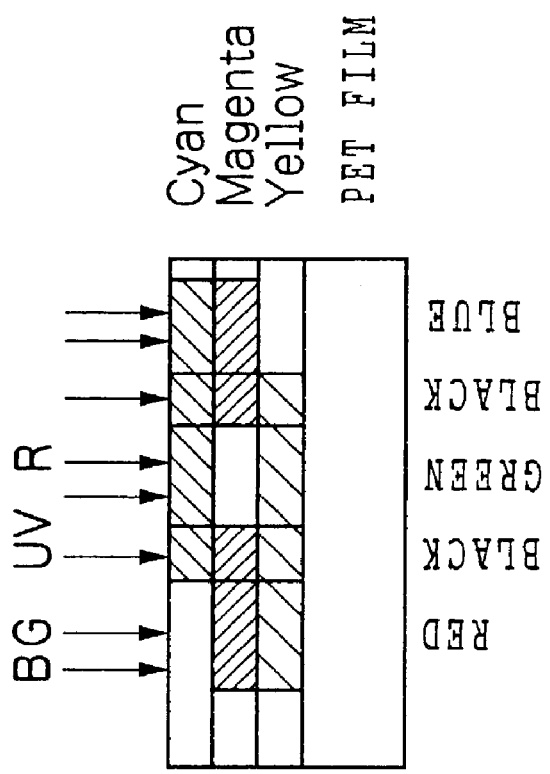
FIGS. 18A and 18B are sectional views showing a method of forming a pattern by plural exposure heads.
Figure 18A:
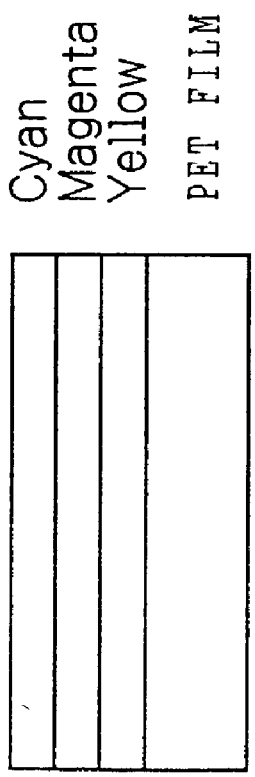

As shown in FIG. 15, an elongated web 122 is used as the medium on which writing is carried out. The web 122 which is fed out by a feed-out device 124 is taken-up by a take-up device 126. A conveying path 128 is formed between the feed-out device 124 and the take-up device 126.

At the conveying path 128, photoresist discharging heads 130 which discharge a photoresist, exposure heads 132, developing liquid discharging heads 134 which discharge developing liquid, etching liquid discharging heads 138 which discharge etching liquid, and rinsing liquid discharging heads 140 which discharge rinsing liquid, are disposed in a direction orthogonal to the conveying path 128, above and below the web 122 which is being conveyed. Adjacent heads are disposed parallel to one another.

In this way, while the web 122 is being conveyed, movement of the web and the respective processings are carried out, and a pattern is formed. Here, the respective heads are disposed above and below the web 122 which is being conveyed. However, it is possible to provide the respective heads either only above or only below the web 122. Further, here, the developing liquid discharging heads 134, the etching liquid discharging heads 138, and the rinsing liquid discharging heads 140 are used. However, it is not absolutely necessary to employ discharging heads, and tanks holding the developing liquid, the etching liquid, and the rinsing liquid, respectively, may be used.

Further, a case in which the exposure head 20 and the discharging heads 22, 24 are line heads as shown in FIG. 1 was described as the combination of the forms of the heads. However, the present invention is not limited to the same. For example, as shown in FIG. 16, an exposure head 142 and discharging heads 144, 146 may be serial heads. (In this case, they can move with respect to a direction orthogonal to the main scanning direction (the direction of arrow A) as well.) Or, although not illustrated, various combinations are possible, such as a case in which the discharging heads are serial heads and the exposure head is a line head, a case in which the discharging heads are line heads and the exposure head is a polygon scanning head, a case in which the discharging heads are line heads and the exposure head is a serial head, and the like.

Because the present invention has the above-described structure, due to a circuit pattern being formed on a medium on which writing is carried out on a same scanning stage, positional offset of respective heads with respect to the medium on which writing is carried out does not arise. Thus, it is easy to make the pattern highly precise.

Moreover, by disposing the respective heads at the same scanning stage, as compared with a case in which a scanning stage is provided for each head, it is possible to simplify the processes, it is possible to shorten the time between the patternings, and it is possible to make pattern formation faster. Thus, a highly accurate pattern can be formed, and there is no fear that the dimensions of the pattern will change due to the conveying between the respective scanning stages, or due to the passage of the time required for movement between patternings.

Moreover, it is possible to form a structure in which wasted material which is ultimately removed such as a photoresist is not needed. Therefore, costs can be decreased. Moreover, because the process for coating a photoresist can be eliminated, the number of processes can be reduced.

In addition, by providing the respective heads at the same scanning stage, as compared with a case in which a scanning stage is provided for each head, the space required for placement of the entire device needed for forming the circuit pattern can be reduced. Moreover, costs and the amount of electricity which is consumed can be reduced.

What is claimed is:

1. A writing device carrying out writing of a multi-layer pattern on a medium, said writing device comprising:
   at least one exposure head and at least one discharging head; and
   a moving device which moves, relatively and in a predetermined direction, the at least one exposure head or at least one discharging head, or both, across the medium on which writing of the multi-layer pattern is carried out,
   wherein the at least one exposure head and at least one discharging head are disposed substantially in the predetermined direction.

2. The device of claim 1, wherein the at least one exposure head is a plurality of exposure heads, each exposure head having a respectively different exposure function.

3. The device of claim 1, wherein the at least one exposure head has a plurality of irradiating heads.

4. The device of claim 3, wherein each irradiating head has a digital micromirror device.

5. The device of claim 1, wherein the at least one discharging head is a plurality of discharging heads, each discharging head discharges a respectively different functional material.

6. The device of claim 1, wherein the medium on which writing is carried out is a printed-board which substantially shaped as a rectangular sheet.

7. The device of claim 1, further comprising a scanning stage for holding the medium on which writing is carried out.

8. The device of claim 1, wherein the medium on which writing is carried out is a web.

9. The device of claim 1, wherein the moving device has a feed-out device for feeding out a wound, web-shaped medium on which writing is carried out, and a take-up device for taking-up the medium on which writing is carried out, and the feed-out device and the take-up device are disposed so as to be set apart from one another.

10. The device of claim 1, wherein at least one head among the least one exposure head or at least one discharging head is a serial head and is movable in a direction substantially orthogonal to the predetermined direction.

11. The device of claim 1, wherein at least one head among the least one exposure head or at least one discharging head is a line head.

12. A writing method which is used in a writing device which has at least one exposure head and at least one discharging head, the heads being disposed substantially in a predetermined direction, said method comprising the steps of:
    providing a medium on which writing is carried out;
    moving, relatively and in a predetermined direction, the at least one exposure head or at least one discharging head, or both, across the medium on which writing is carried out;
    as said relative movement is carried out, discharging a functional material from the at least one discharging head onto the medium on which writing is carried out; and
    irradiating the function material using the at least one exposure head.

13. The method of claim 12, wherein the at least one discharging head is a photoresist discharging head and discharges a photoresist.

14. The method of claim 12, further comprising, after the step of irradiating the functional material, a step of discharging a developing liquid.

15. The method of claim 12, wherein the medium on which writing is carried out is electrically conductive.

* * * * *